United States Patent
Katsumata et al.

(10) Patent No.: US 7,019,349 B2
(45) Date of Patent: Mar. 28, 2006

(54) SEMICONDUCTOR MEMORY DEVICE WITH CAP STRUCTURE AND METHOD OF MANUFACTURING THE SAME

(75) Inventors: Ryota Katsumata, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/817,954

(22) Filed: Apr. 6, 2004

(65) Prior Publication Data

US 2005/0145913 A1    Jul. 7, 2005

(30) Foreign Application Priority Data

Jan. 6, 2004   (JP)   .............................. 2004-001073

(51) Int. Cl.
  *H01L 21/2842*  (2006.01)
  *H01L 29/94*    (2006.01)
(52) U.S. Cl. ..................... 257/301; 257/304; 257/327; 257/618
(58) Field of Classification Search ................ 257/301, 257/304, 327, 618
See application file for complete search history.

(56) References Cited

U.S. PATENT DOCUMENTS

| | | | | |
|---|---|---|---|---|
| 6,635,525 | B1 * | 10/2003 | Mandelman et al. | 438/243 |
| 6,720,606 | B1 * | 4/2004 | Nitayama et al. | 257/306 |
| 2001/0050388 | A1 * | 12/2001 | Hamamoto | 257/301 |
| 2003/0032237 | A1 * | 2/2003 | Clevenger et al. | 438/243 |
| 2003/0168690 | A1 * | 9/2003 | Karcher et al. | 257/301 |
| 2003/0201480 | A1 * | 10/2003 | Chidambarrao et al. | 257/301 |
| 2004/0159873 | A1 * | 8/2004 | Goldbach et al. | 257/301 |

FOREIGN PATENT DOCUMENTS

| | | | |
|---|---|---|---|
| JP | 1-149453  | * | 6/1989 |
| JP | 8-172173  | * | 9/1996 |
| JP | 11-204758 | * | 7/1999 |

OTHER PUBLICATIONS

M. Gutsche, et al., "Capacitance Enhancement Techniques for Sub-100nm Trench DRAMs", IEEE, 2001.

J. Lee, et al., "mass Production Worthy $HfO_2$-$Al_2O_3$ Laminate Capacitor Technology Using Hf Liquid Precursor for Sub-100hm DRAMs", IEEE, 2002.

H. Seidl, et al., "A Fully Integrated $Al_2O_3$ Trench Capacitor DRAM for Sub-100nm Technology", IEEE, 2002.

* cited by examiner

*Primary Examiner*—Nathan J. Flynn
*Assistant Examiner*—Ahmed N. Sefer
(74) *Attorney, Agent, or Firm*—Banner & Witcoff Ltd.

(57) ABSTRACT

A semiconductor memory device includes a trench capacitor formed in a major surface portion of a semiconductor substrate. The trench capacitor includes a storage node electrode provided within a trench formed in the major surface portion of substrate, a plate electrode disposed opposed to the storage node electrode, and a capacitor insulation film provided between the storage node electrode and plate electrode and formed of high-dielectric-constant material. The memory device further includes an insulated-gate field-effect transistor formed in the major surface portion of substrate, a contact portion that electrically connects a source or drain of the IGFET and the storage node electrode, and a cap structure formed between the contact portion and upper parts of the storage node electrode.

13 Claims, 20 Drawing Sheets

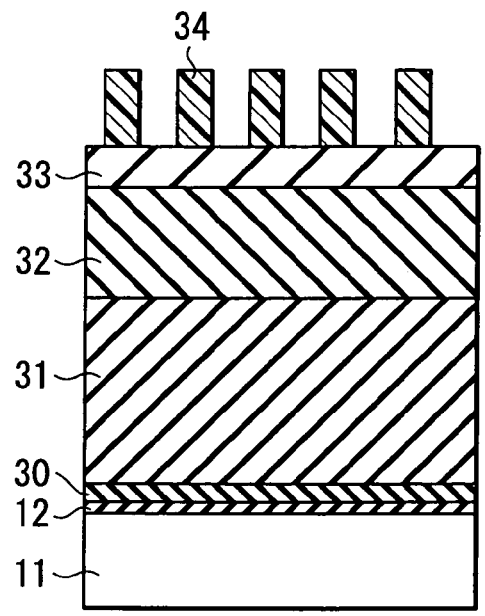
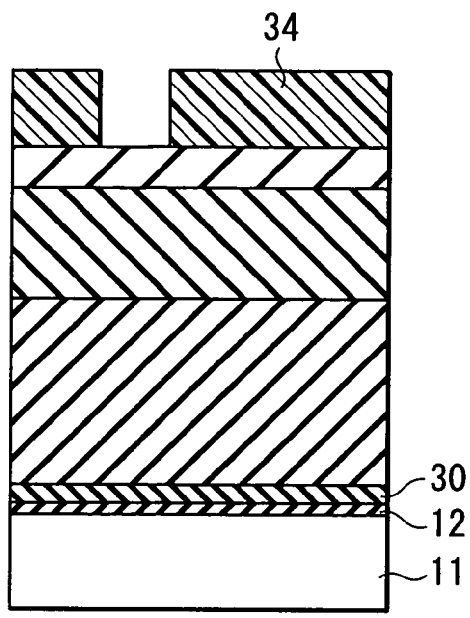
FIG. 6A  FIG. 6B
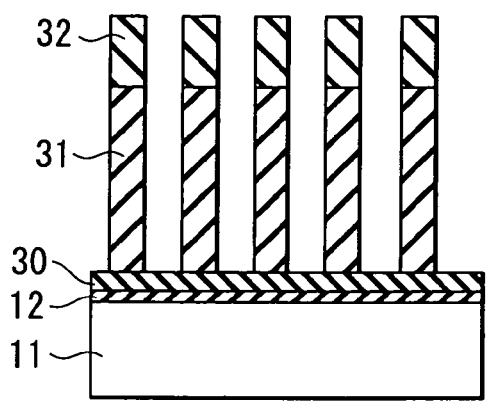
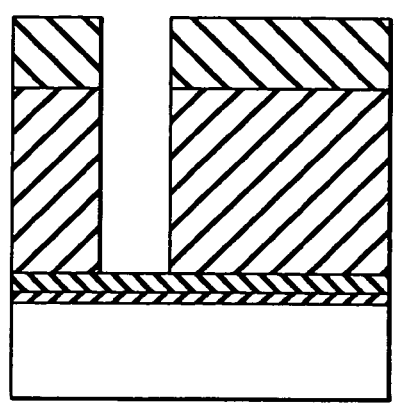
FIG. 7A  FIG. 7B

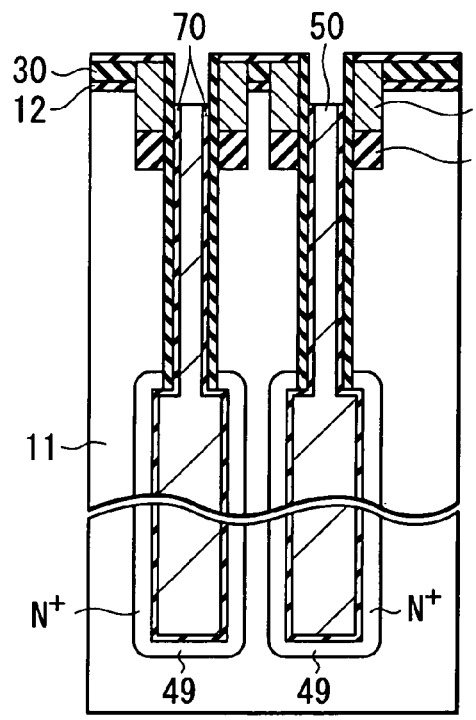
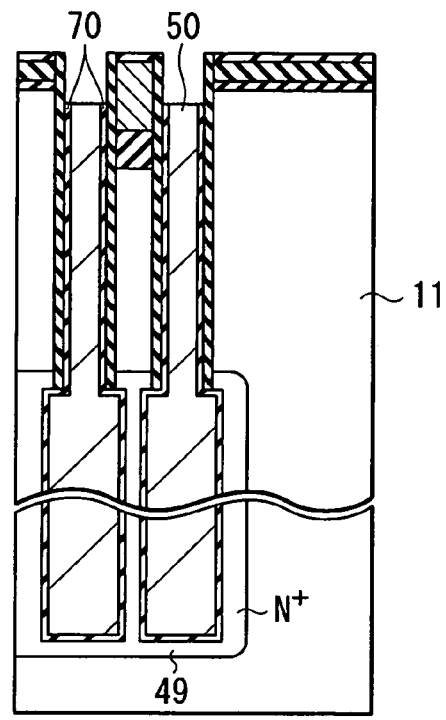
FIG. 19A  FIG. 19B
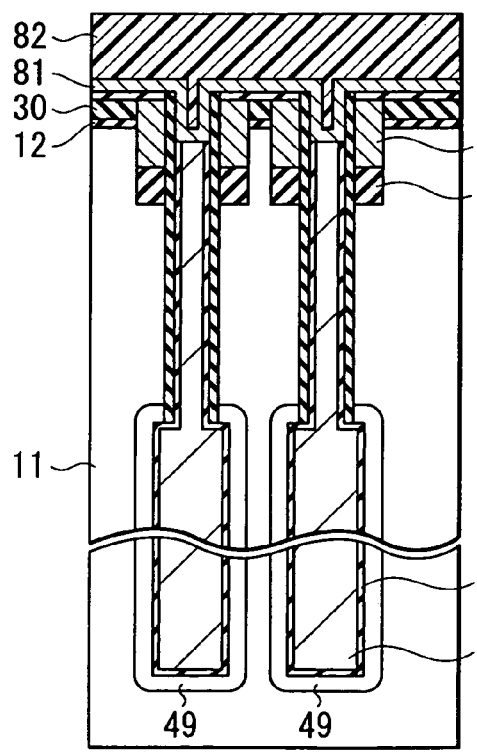
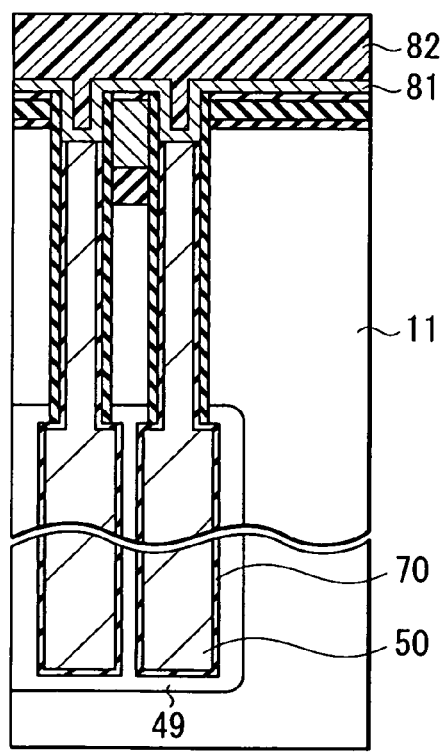
FIG. 20A  FIG. 20B

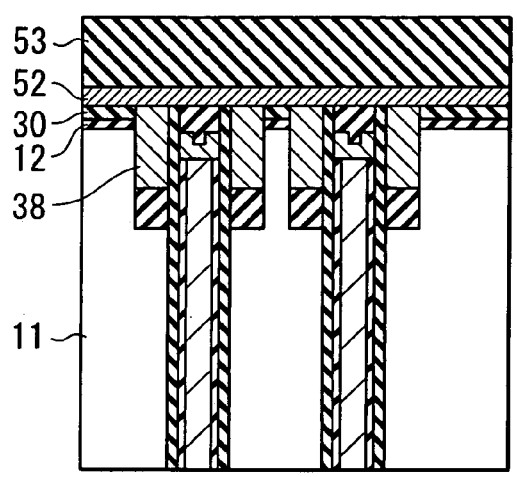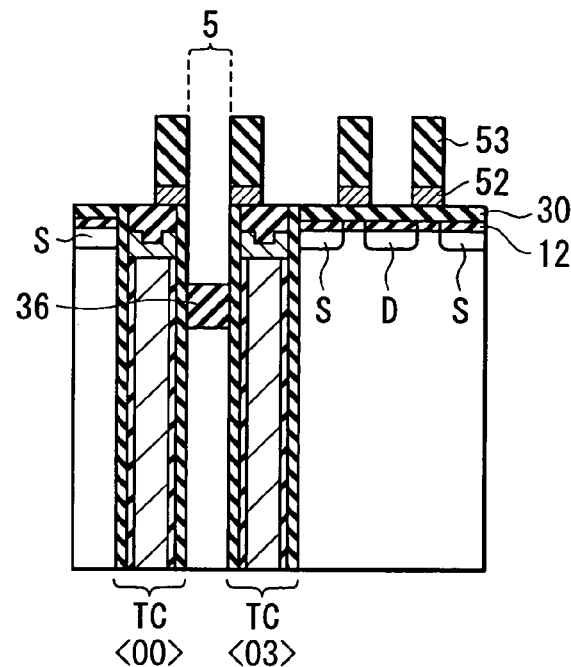
FIG. 24A  FIG. 24B
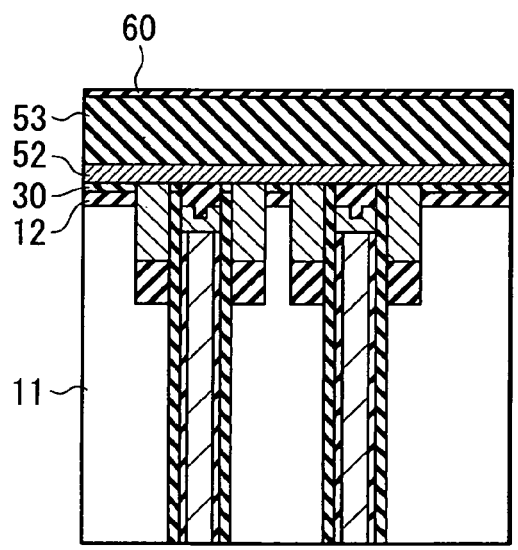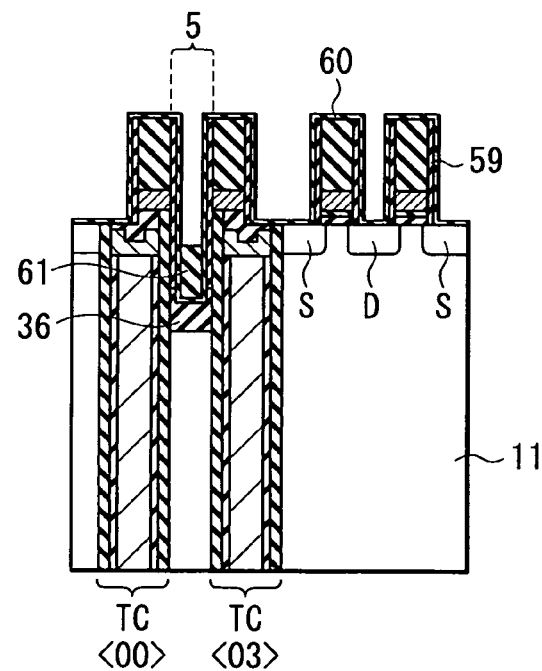
FIG. 25A  FIG. 25B

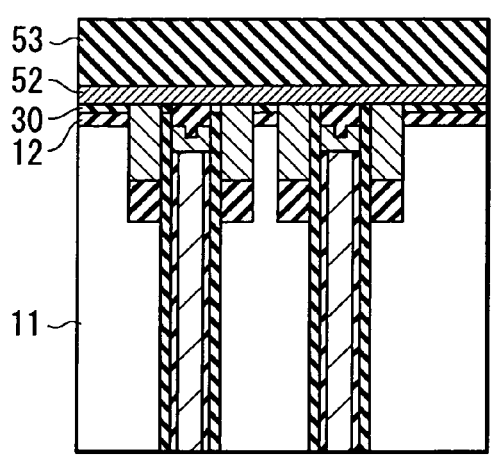
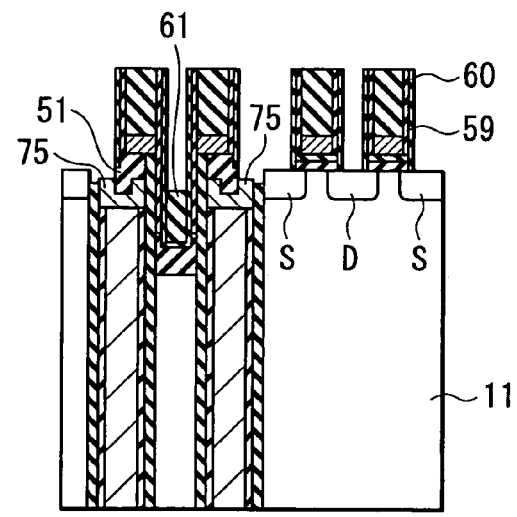
FIG. 26A    FIG. 26B
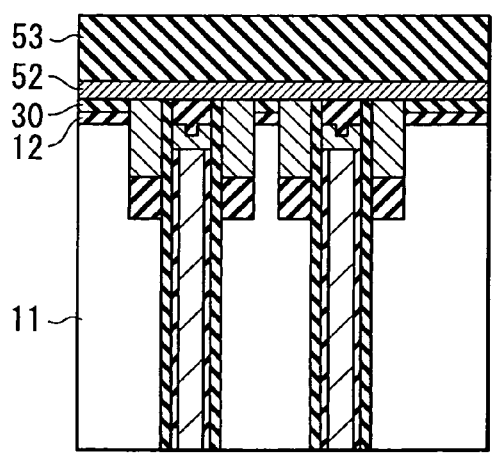
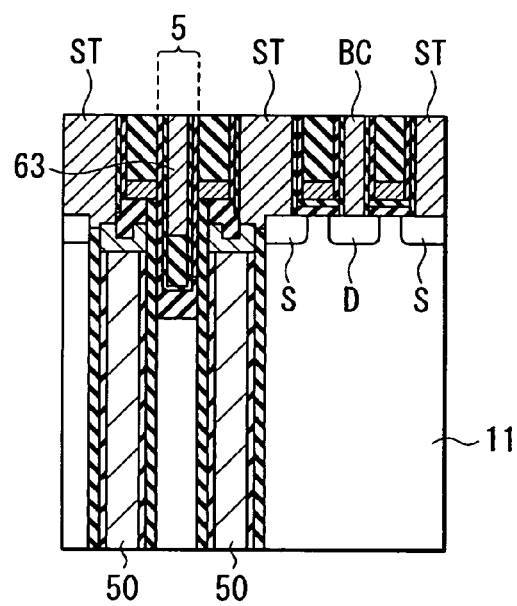
FIG. 27A    FIG. 27B

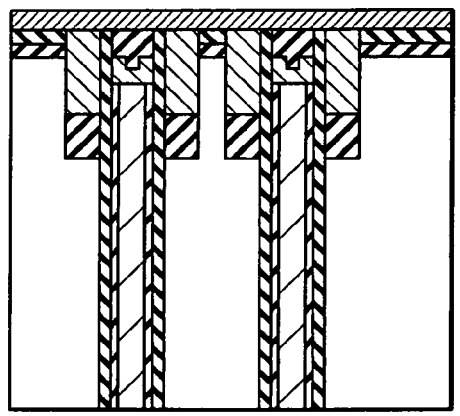
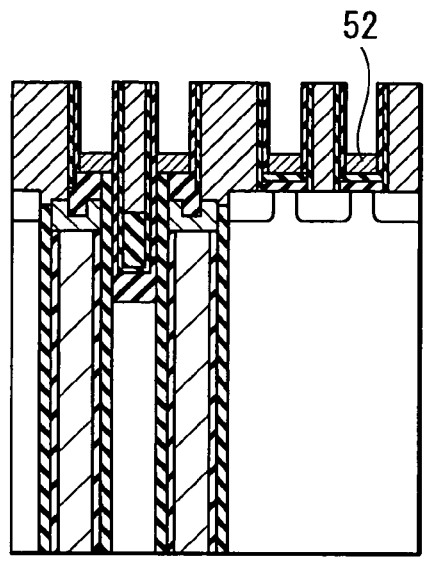
FIG. 28A          FIG. 28B
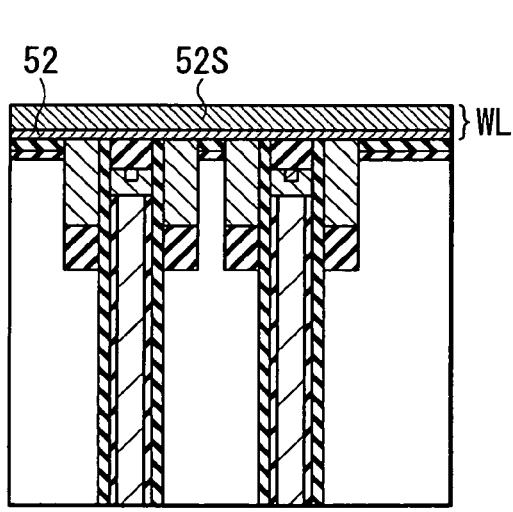
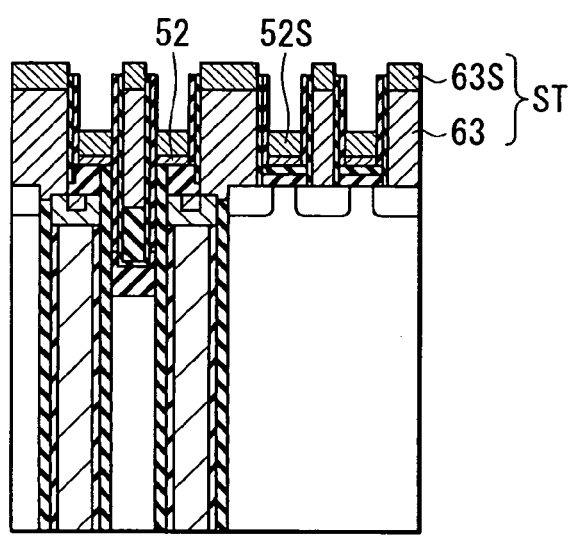
FIG. 29A          FIG. 29B

SEMICONDUCTOR MEMORY DEVICE WITH CAP STRUCTURE AND METHOD OF MANUFACTURING THE SAME

CROSS-REFERENCE TO RELATED APPLICATIONS

This application is based upon and claims the benefit of priority from the prior Japanese Patent Application No. 2004-001073, filed Jan. 6, 2004, the entire contents of which are incorporated herein by reference.

BACKGROUND OF THE INVENTION

1. Field of the Invention

The present invention relates generally to a semiconductor memory device and a method of manufacturing the semiconductor memory device. More particularly, the invention relates to, for instance, a trench-capacitor DRAM.

2. Description of the Related Art

With a further shrink in DRAM (Dynamic Random Access Memory) cell size, the area of the capacitor has decreased more and more, and it is difficult to ensure a sufficient capacitance of the capacitor. In the situation, more importance is placed on technology wherein a high-dielectric-constant material such as $Al_2O_3$, TaO or BSTO is used for the capacitor insulation film of the cell capacitor, and a greater accumulation capacitance is ensured with the same pattern occupation area. In the case where a high-dielectric-constant film, which is typically a metal oxide, is applied to the trench-type cell, as mentioned above, it is necessary to bury a high-dielectric-constant material in the trench capacitor that is formed in the semiconductor substrate. In this case, it is imperative to reduce as much as possible the area at which the semiconductor substrate contacts the high-dielectric-constant film, and to provide the structure that prevents contact with the vicinity of the cell transistor, which may lead to cell leak. The reason is that if the high-dielectric-constant material included in the capacitor insulation film diffuses into the substrate, the diffused material would become a trap center, resulting in an increase in junction leakage current and degradation in retention characteristics.

In the conventional trench capacitor cell structure, which is generally called "BEST cell structure", a storage node and a diffusion layer of each cell transistor are coupled within the substrate. Thereby, the trench capacitor and cell transistors are electrically connected. In this case, however, the high-dielectric-constant film, which is formed as the capacitor insulation film, and the diffusion layer of the cell transistor come in direct contact with each other. Alternatively, the high-dielectric-constant film and the diffusion layer of the cell transistor contact each other via a surface strap. Consequently, impurities in the high-dielectric-constant film may possibly diffuse into the junction region in the substrate or into the surface strap. Like the above-described case, a junction leak due to diffusion of the impurities will increase, and the retention characteristics may deteriorate. Hence, even in the case where the high-dielectric-constant film is applied to the BEST cell, it is necessary to solve the problem of the degradation in retention characteristics.

Normally, the BEST cell is fabricated by a step of forming an active area of a cell transistor, after the formation of a trench capacitor. Thus, a step of removing a side face portion of the trench capacitor along the active area is indispensable. In this case, the high-dielectric-constant film may possibly be exposed at the time of processing the active area, and the high-dielectric-constant impurities may re-adsorb. This may lead to deterioration in retention characteristics.

For instance, IEEE 2002 (H. Seidl et al., "A Fully Integrated $Al_2O_3$ Trench Capacitor DRAM For Sub-100 nm Technology") proposes a technique for solving the above-described problem. In this technique, the following fabrication step is added. That is, after the processing of a trench, a high-dielectric-constant film is formed. Then, a storage node electrode of polysilicon is formed by deposition, and the storage node is recessed. Thereafter, the high-dielectric-constant film at the upper part of the trench is removed by wet etching.

In this technique, however, it is necessary to directly deposit the high-dielectric-constant film on the region that becomes a source or drain diffusion layer of the cell transistor. It is very difficult to sufficiently remove the impurities of the high-dielectric-constant material by wet etching, etc. Possible diffusion of residual impurities may degrade the retention characteristics of the DRAM cell. In general, $Al_2O_3$, used in the aforementioned document, requires sufficient anneal prior to formation of a storage node electrode. Although varying depending on the method of forming the $Al_2O_3$ film, when an atomic layer deposition (ALD) method that is widely used in recent years is applied, a great deal of excess Al-based or C-based impurities remains after the film formation. By annealing out such impurities, satisfactory film characteristics are obtained. If a storage node electrode is formed in the state in which annealing is insufficient, and a high-temperature, long-time heat treatment for the DRAM is carried out, the excess Al, that is P-type impurities, diffuses into the storage node electrode, depletes the surface of the storage node electrode and decreases the capacitance of the capacitor. Furthermore, it is very difficult to wet-etch the high-dielectric-constant material such as $Al_2O_3$ film, which is crystallized by adequate annealing. In the manufacturing method of the above-described document, there are problems of not only a decrease in retention characteristics, but also depletion of the storage node electrode due to the impurities.

BRIEF SUMMARY OF THE INVENTION

According to an aspect of the present invention, there is provided a semiconductor memory device comprising a trench capacitor formed in a major surface portion of a semiconductor substrate, the trench capacitor including a storage node electrode provided within a trench that is formed in the major surface portion of the semiconductor substrate, a plate electrode that is disposed to be opposed to the storage node electrode, and a capacitor insulation film that is provided between the storage node electrode and the plate electrode and is formed of a high-dielectric-constant material, an insulated-gate-type field-effect transistor that is formed in the major surface portion of the semiconductor substrate, a contact portion that electrically connects a source or a drain of the insulated-gate-type field-effect transistor and the storage node electrode, and a cap structure formed between the contact portion and upper parts of the storage node electrode.

According to another aspect of the invention, there is provided a method of manufacturing a semiconductor memory device comprising forming, by anisotropic etching, a trench in a major surface portion of a semiconductor substrate, forming a plate electrode by introducing impurities of a conductivity type, which is opposite to a conductivity type of the semiconductor substrate, into the semiconductor substrate along an inner wall of the trench, forming a collar insulation film on an inside of the trench by LOCOS, forming a high-dielectric-constant film along the collar insulation film and a side wall in the trench, annealing the high-dielectric-constant film until the high-dielectric-constant film is crystallized, thus forming a capacitor insulation film; and removing the capacitor insulation film that is formed along the collar insulation film and is located at an upper part of the trench.

BRIEF DESCRIPTION OF THE SEVERAL VIEWS OF THE DRAWING

FIG. 6A illustrates a fabrication step of the semiconductor memory device according to the second embodiment of the invention, FIG. 6A being a cross-sectional view taken along line 4—4 in FIG. 2;

FIG. 6B illustrates a fabrication step of the semiconductor memory device according to the second embodiment of the invention, FIG. 6B being a cross-sectional view taken along line 3—3 in FIG. 2;

FIG. 7A illustrates a fabrication step of the semiconductor memory device according to the second embodiment of the invention, FIG. 7A being a cross-sectional view taken along line 4—4 in FIG. 2;

FIG. 7B illustrates a fabrication step of the semiconductor memory device according to the second embodiment of the invention, FIG. 7B being a cross-sectional view taken along line 3—3 in FIG. 2;

FIG. 19A illustrates a fabrication step of the semiconductor memory device according to the second embodiment of the invention, FIG. 19A being a cross-sectional view taken along line 4—4 in FIG. 2;

FIG. 19B illustrates a fabrication step of the semiconductor memory device according to the second embodiment of the invention, FIG. 19B being a cross-sectional view taken along line 3—3 in FIG. 2;

FIG. 20A illustrates a fabrication step of the semiconductor memory device according to the second embodiment of the invention, FIG. 20A being a cross-sectional view taken along line 4—4 in FIG. 2;

FIG. 20B illustrates a fabrication step of the semiconductor memory device according to the second embodiment of the invention, FIG. 20B being a cross-sectional view taken along line 3—3 in FIG. 2;

FIG. 24A illustrates a fabrication step of the semiconductor memory device according to the second embodiment of the invention, FIG. 24A being a cross-sectional view taken along line 4—4 in FIG. 2;

FIG. 24B illustrates a fabrication step of the semiconductor memory device according to the second embodiment of the invention, FIG. 24B being a cross-sectional view taken along line 3—3 in FIG. 2;

FIG. 25A illustrates a fabrication step of the semiconductor memory device according to the second embodiment of the invention, FIG. 25A being a cross-sectional view taken along line 4—4 in FIG. 2;

FIG. 25B illustrates a fabrication step of the semiconductor memory device according to the second embodiment of the invention, FIG. 25B being a cross-sectional view taken along line 3—3 in FIG. 2;

FIG. 26A illustrates a fabrication step of the semiconductor memory device according to the second embodiment of the invention, FIG. 26A being a cross-sectional view taken along line 4—4 in FIG. 2;

FIG. 26B illustrates a fabrication step of the semiconductor memory device according to the second embodiment of the invention, FIG. 26B being a cross-sectional view taken along line 3—3 in FIG. 2;

FIG. 27A illustrates a fabrication step of the semiconductor memory device according to the second embodiment of the invention, FIG. 27A being a cross-sectional view taken along line 4—4 in FIG. 2;

FIG. 27B illustrates a fabrication step of the semiconductor memory device according to the second embodiment of the invention, FIG. 27B being a cross-sectional view taken along line 3—3 in FIG. 2;

FIG. 28A illustrates a fabrication step of the semiconductor memory device according to the second embodiment of the invention, FIG. 28A being a cross-sectional view taken along line 4—4 in FIG. 2;

FIG. 28B illustrates a fabrication step of the semiconductor memory device according to the second embodiment of the invention, FIG. 28B being a cross-sectional view taken along line 3—3 in FIG. 2;

FIG. 29A illustrates a fabrication step of the semiconductor memory device according to the second embodiment of the invention, FIG. 29A being a cross-sectional view taken along line 4—4 in FIG. 2;

FIG. 29B illustrates a fabrication step of the semiconductor memory device according to the second embodiment of the invention, FIG. 29B being a cross-sectional view taken along line 3—3 in FIG. 2;

DETAILED DESCRIPTION OF THE INVENTION

Figure 1:
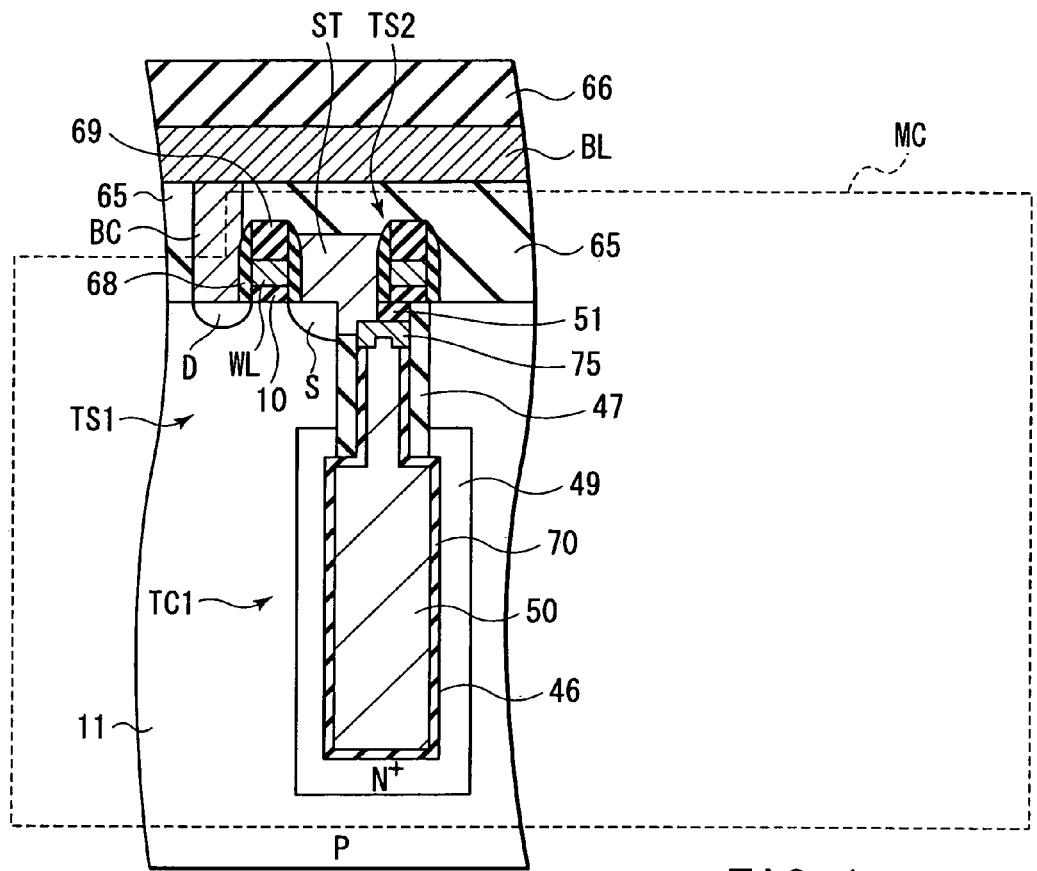
FIG. 1 is a view for describing a semiconductor memory device according to a first embodiment of the present invention, FIG. 1 being a cross-sectional view schematically illustrating the structure of a DRAM cell.

Embodiments of the present invention will now be described with reference to the accompanying drawings. In the description below, common parts are denoted by like reference numerals throughout all the drawings.

[First Embodiment]

The schematic structure of a semiconductor memory device according to a first embodiment of the present invention will now be described with reference to FIG. 1. FIG. 1 is a cross-sectional view schematically illustrating the semiconductor memory device according to the first embodiment of the invention.

As is shown in FIG. 1, a memory cell MC includes a cell transistor TS1, which is formed in a major surface portion of a semiconductor substrate 11, and a trench capacitor TC1. The memory cell MC is formed at an intersection of a bit line BL and a word line WL formed on the major surface of the substrate 11. A transistor TS2, which is formed above the trench capacitor TC1, is provided along a so-called passing word line. The transistor TS2 is not a transistor of the memory cell MC shown in this cross section.

The cell transistor TS1 comprises a gate insulation film 10 that is formed on the major surface of the substrate 11; a gate electrode that is formed on the gate insulation film 10 and functions as a word line WL; a source S and a drain D that are formed in the major surface portion of the substrate 11 and are spaced apart so as to sandwich the gate electrode; and a spacer 68 and an upper insulation film 69 that are formed, respectively, on a side wall and on an upper part of the gate electrode.

The cell transistor TS1 shown in FIG. 1 is a so-called planar type field-effect transistor. The cell transistor TS1, however, may adopt another structure such as a fin-gate structure, as will be described later.

The trench capacitor TC1 is formed within a trench 46 that is formed in the major surface portion of the substrate 11. A collar oxide film 47 is formed at an upper part of the trench 46. Impurities of a conductivity type that is opposite to the conductivity type of the semiconductor substrate 11 are diffused in that part of the substrate 11, which is in contact with the trench 46, whereby a plate electrode 49 is formed. The plate electrode 49 is, for instance, an N$^+$ type region doped with As, etc., in the case where the semiconductor substrate 11 is of a P-type. A capacitor insulation film 70 is formed of a high-dielectric-constant material along the inner wall of the trench 46. The trench 46 contains a storage node electrode 50 that is opposed to the plate electrode 49 via the capacitor insulation film 70. A cap structure 75 is formed on the capacitor insulation film 70 and storage node electrode 50 within the trench 46. The cap structure 75 has a peripheral portion that is thicker than a central portion thereof. In other words, a region of the cap structure 75, which lies on the capacitor insulation film 70, is thicker than, a region of the cap structure 75, which lies on the storage node electrode 50. A buried insulation film 51 is formed on the cap structure 75.

A surface strap (contact portion) ST is formed to electrically connect the storage node electrode 50 and source S via the cap structure 75. Thus, the cap structure 75 is formed between the surface strap ST and the upper parts of the capacitor insulation film 70 and storage node electrode 50. A bit line contact BC is formed in an interlayer insulation film 65. The bit line contact BC electrically connects the drain D and bit line BL. An interlayer insulation film 66 is formed on the bit line BL.

It is desirable that the high-dielectric-constant material contain at least one of high-dielectric-constant elements comprising Al, Ta, Zr, Hf, Pb, Ba and Sr. The high-dielectric-constant material may be a stacked layer of these high-dielectric-constant elements. Further, the high-dielectric-constant material may be an oxide film of the high-dielectric-constant element such as $Al_2O_3$, TaO, HfO or BSTO.

Preferably, the storage node electrode 50 is formed of, e.g. polysilicon, a metal, or a barrier metal material serving as a barrier to the high-dielectric-constant material. It is desirable that the metal includes at least one of TiN, W, Al, Ru, Au, Cu, Ag, Pt and Ti. In addition, it is desirable that the barrier metal material contain at least one of TaN and WN.

Similarly, it is desirable that the cap structure 75 be formed of, e.g. polysilicon or a metal. Examples of the metal are the same as those of the above-mentioned material.

As stated above, the cap structure 75 is interposed between the surface strap ST and the upper parts of the capacitor insulation film 70 and storage node electrode 50 within the trench. Hence, the cap structure 75 seals the capacitor insulation film 70 within the trench capacitor, thereby preventing direct contact between the capacitor insulation film 70 and surface strap ST. It is possible, therefore, to prevent the high-dielectric-constant material from diffusing into the surface strap ST. For example, when the $Al_2O_3$ is used as the high-dielectric-constant material, it is possible to prevent Al from diffusing into the surface strap ST. As a result, a junction leak due to diffusion of the high-dielectric-constant material can be suppressed, and the retention characteristics (charge retention characteristics) can be enhanced.

The cap structure 75 has a greater thickness at the peripheral part than at the central part. In addition, the capacitor insulation film 70 is formed under the peripheral part of the cap structure 75 that has the greater thickness. It is thus possible to effectively prevent the high-dielectric-constant material in the capacitor insulation film 70 from diffusing into the surface strap ST. Therefore, the retention characteristics can be enhanced.

On the other hand, the cap structure 75 has a less thickness at the central part than at the peripheral part. This reduces contact resistance between the storage node electrode 50 and surface strap ST. Therefore, the switching characteristics can be enhanced. As described above, since the cap structure 75 has a greater thickness at the peripheral part than at the central part, the retention characteristics can be enhanced and the switching characteristics improved.

Moreover, even in the case where the storage node electrode 50 is formed of a metal or a barrier metal material, the cap structure 75 has the same function as described above. Specifically, the metal in the storage node electrode 50 is prevented from diffusing into the surface strap ST. Since the storage node electrode 50 is formed of the metal or barrier metal material, the resistance value decreases and the switching characteristics are enhanced. In particular, in usual cases, the trench 46 is formed down to a deep point in the substrate 11. Therefore, this structure is advantageous, and the retention characteristics and the switching characteristics can be enhanced.

[Second Embodiment]

Next, a semiconductor memory device according to a second embodiment of the present invention and a method of manufacturing the semiconductor memory device will now be described. In this embodiment, a so-called fin-gate-type field effect transistor (fin-gate-type double-gate transistor) is used as a cell transistor. This semiconductor memory device is a DRAM having a memory cell array that is formed in the following manner. A pair of fin-gate-type field-effect transistors and a pair of trench capacitors in the associated memory cells MC are arrange adjacent to each other. In addition, the paired double-gate transistors and paired trench capacitors TC are alternately arranged in a staggered fashion. In the description below, the parts common to those in the first embodiment are not described.

Figure 2:
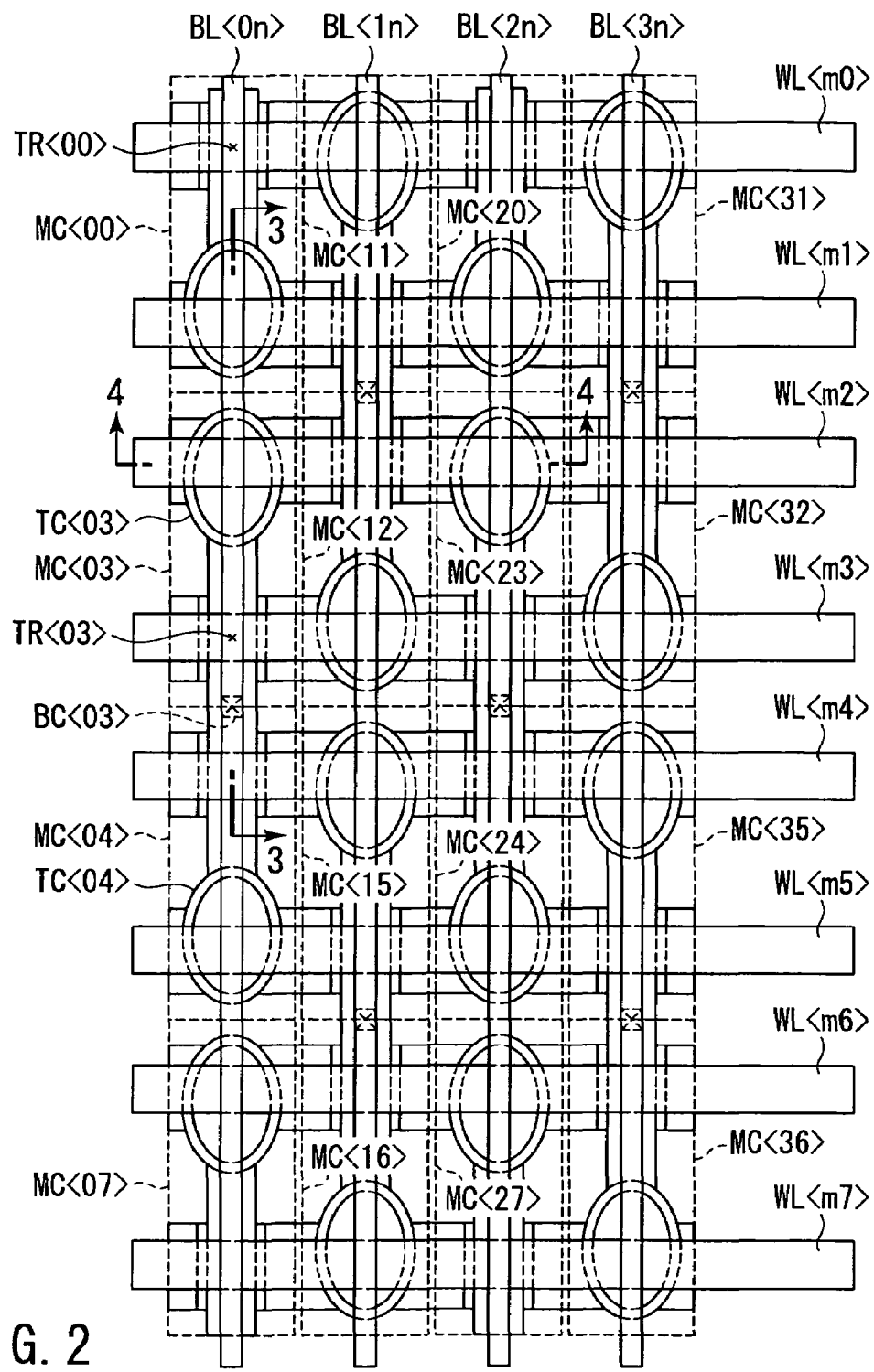
FIG. 2 is a view for describing a semiconductor memory device according to a second embodiment of the present invention, FIG. 2 being a plan view schematically illustrating a memory cell array of DRAM cells using fin-gate-type double-gate transistors.

To begin with, an example of a pattern layout of the memory cell array is described referring to FIG. 2. FIG. 2 is a plan view that schematically shows the memory cell array of DRAM cells using fin-gate-type double-gate transistors and trench capacitors TC. In FIG. 2, <mn> (m, n=a positive integer) corresponds to <column & row> of each memory cell.

In FIG. 2, MC <00> to MC <36>, which are boxed by broken lines, are 1-bit memory cells. The memory cells MC (MC <00> to MC <36>) are provided at intersections of bit lines BL (BL <0> to BL <3>) and word lines WL (WL <0> to WL <7>).

Each memory cell MC comprises a fin-gate-type double-gate transistor TR (TR <00> to TR <36>), which function as a cell transistor, and a trench capacitor TC (TC <00> to TC <36>). A source region of each transistor TR is connected to one of electrodes of the associated trench capacitor TC. A drain region of each transistor TR is shared by a drain region of a transistor TR in the adjacent memory cell MC. Thereby, a pair of memory cells MC are formed. The drain region of each transistor TR is connected to the associated bit line BL via a bit line contact (connection portion) BC. The paired memory cells MC are arranged such that the transistors TR and trench capacitors TC are alternately disposed in the direction of word lines WL. The area occupied by the pattern can be reduced by alternately arranging the paired double-gate transistors and paired trench capacitors in a staggered fashion.

The plan-view shape of the trench capacitor TC is oval, as shown in FIG. 2. Alternatively, it may be circular, etc.

Figure 5:
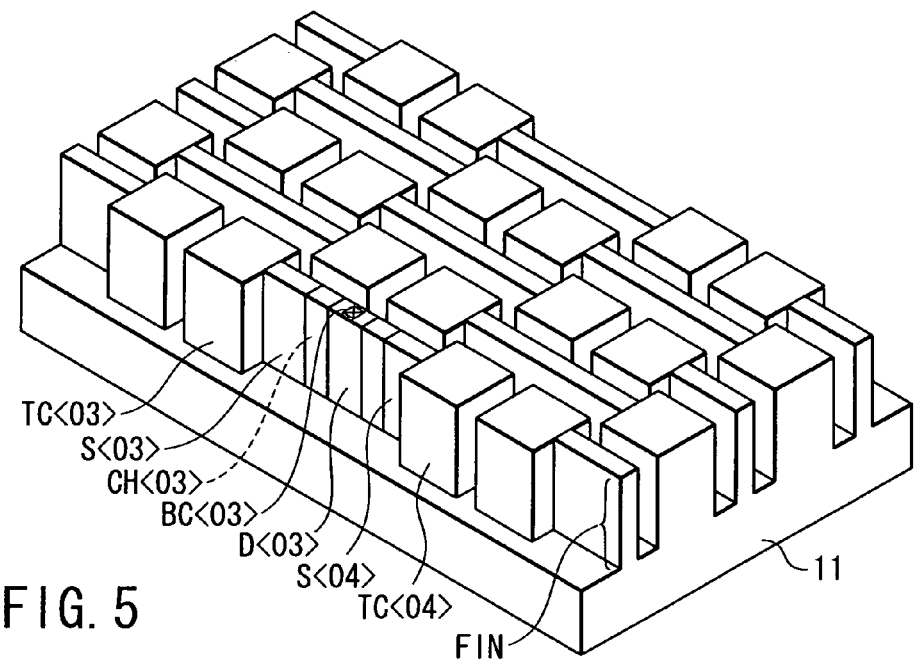
FIG. 5 is a view for describing the semiconductor memory device according to the second embodiment of the present invention, FIG. 5 being a perspective view schematically showing a main part of the memory cell array.
Figure 3:
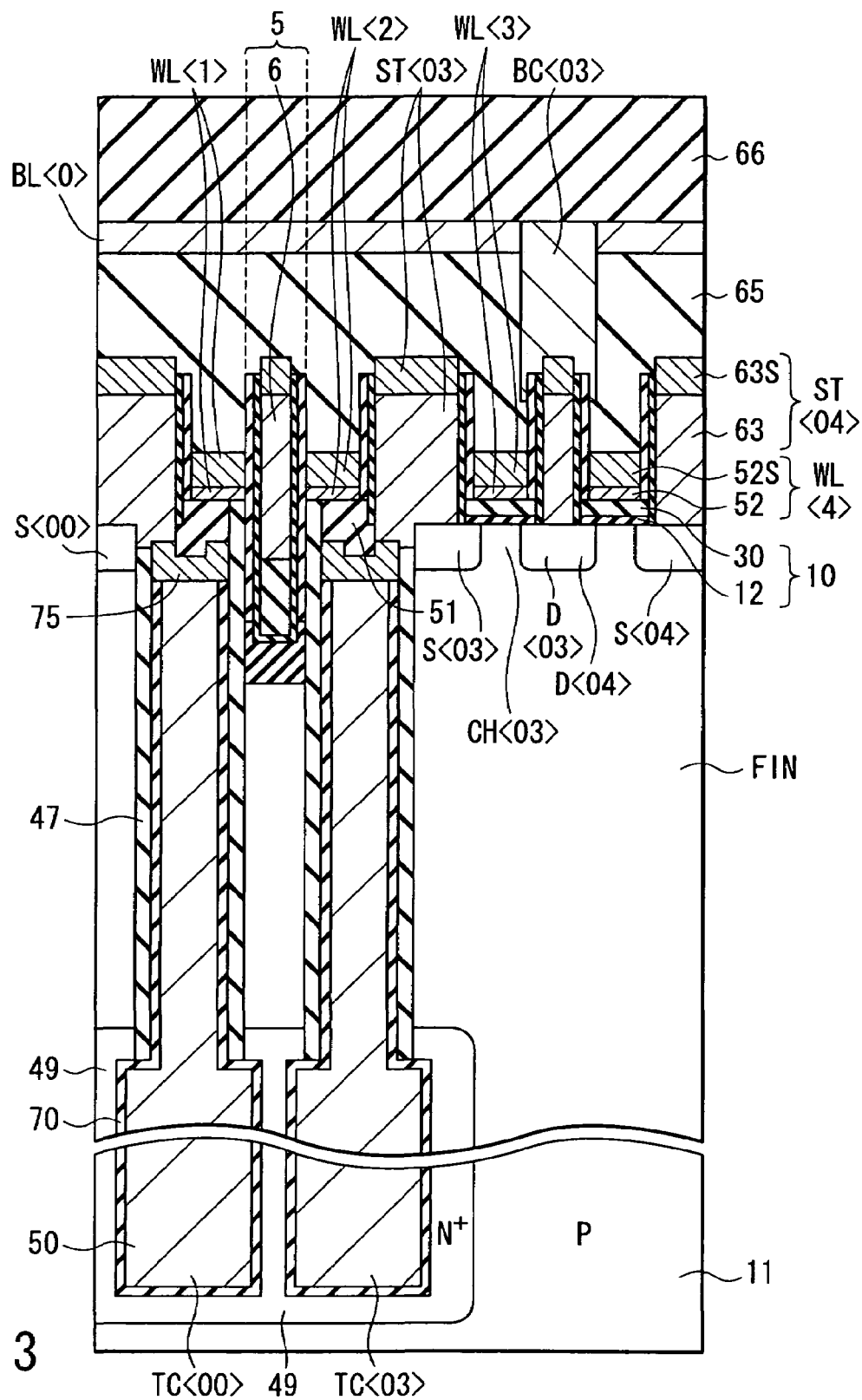
FIG. 3 is a view for describing the semiconductor memory device according to the second embodiment of the present invention, FIG. 3 being a cross-sectional view, taken along line 3—3 in FIG. 2, illustrating the structure of the DRAM cell.
Figure 4:
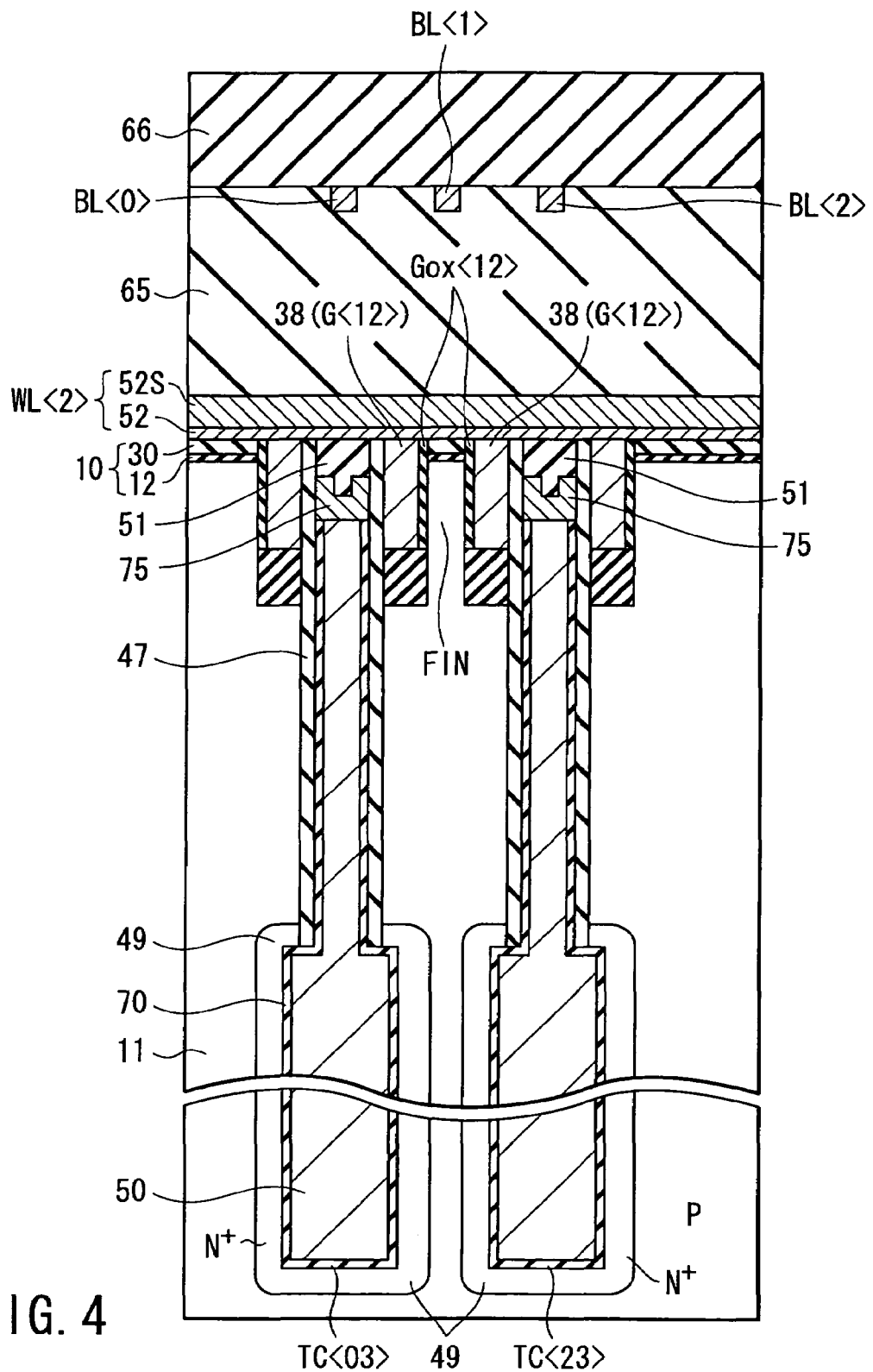
FIG. 4 is a view for describing the semiconductor memory device according to the second embodiment of the present invention, FIG. 4 being a cross-sectional view, taken along line 4—4 in FIG. 2, illustrating the structure of the DRAM cell.

Paying attention to the memory cell MC <03> and memory cell MC <04> in FIG. 2, a detailed description is given of the cross-sectional structure of the memory cells with reference to FIG. 3 and FIG. 4, and the three-dimensional structure referring to FIG. 5.

FIG. 3 is a cross-sectional view taken along line 3—3 in FIG. 2. FIG. 4 is a cross-sectional view taken along line 4—4 in FIG. 2, and FIG. 5 is a perspective view schematically showing a main part of the memory cell array shown in FIG. 2.

A semiconductor substrate 11 is provided with a projecting semiconductor region (hereinafter referred to as "pillar") FIN. The pillar FIN is formed by processing a surface portion of the silicon substrate 11 in a projecting shape. The height of the pillar FIN is, e.g. 0.3 to 1.0 µm, but it may be less than 0.3 µm. A channel region CH<03> is formed on both side walls of the pillar FIN. Boron (B), for instance, is ion-implanted in the channel region CH<03> for adjusting the threshold voltage.

As is shown in FIG. 4, a gate insulating film $G_{OX}$<12> is formed on the surface of a channel region CH<03> (not shown). The thickness of the gate insulating film $G_{OX}$<12> is, e.g. 5 nm. In addition, as shown in FIG. 3, each source region S is connected to one of the electrodes (storage electrode 50) of the trench capacitor TC via a surface strap ST. Each surface strap ST has a stacked structure comprising a polysilicon layer 63 and a high-melting-point metal silicide layer 63S. For example, the surface strap ST<03> of memory cell MC<03> is put in contact with parts of the upper surface and side wall of the source region S<03> formed on the side surface of the pillar FIN. Thus, the source region S<03> and the storage electrode 50 of trench capacitor TC<03> are electrically connected. Alternatively, the source region S<03> and surface strap ST<03> may be connected such that only the upper surface or the side wall of the source region S<03> contacts the surface strap ST<03>. The reason is that it should suffice if sufficient electrical connection is established between the source region S and surface strap ST. The resistance value between the source region S and trench capacitor TC can be decreased by connecting the source region S and the storage electrode 50 of trench capacitor TC in this manner.

The trench capacitor TC comprises the storage electrode 50 and plate electrode 49, which are formed via the capacitor insulating film 70. The storage electrode 50 is formed of, e.g. polysilicon buried in the trench, and the plate electrode 49 is formed of, e.g. an $N^+$ type region that is formed by diffusing arsenic (As) in the substrate 11. The capacitor insulation film 70 is formed of a high-dielectric-constant material such as $Al_2O_3$. The storage electrode 50 and capacitor insulation film 70 may be formed of other materials that have been mentioned in connection with the first embodiment.

A word line WL is formed on the upper surface of the pillar FIN such that a gate insulation film 10 having a thickness of, e.g. about 0.1 µm or less, is interposed therebetween. For example, a word line (active word line) WL<3> is formed via the gate insulation film 10 formed on the channel region of the memory cell MC<03>. The active word line WL, in this example, is a word line for switching the transistor provided immediately below. The word line WL comprises a polysilicon layer 52 and a high-melting-point metal silicide layer 52S. The gate insulation film 10 comprises, for example, a silicon oxide film 12 with a thickness of about 0.002 µm and a silicon nitride film 30 with a thickness of about 0.07 µm.

In addition, as shown in FIG. 3 and FIG. 4, a cap structure 75 is interposed between the surface strap ST and the upper parts of the capacitor insulation film 70 and storage node electrode 50 within the trench.

The cap structure 75 has a greater film thickness at the peripheral portion than at the central portion. The cap structure 75 has a concave cross section. The capacitor insulation film 70 is formed under the thick peripheral portion of the cap structure 75.

A buried insulation film 51 is formed on the upper surface of the trench capacitor TC. A collar insulation film 47 is formed along the inner wall of the upper part of the trench capacitor TC. The thickness of the buried insulation film 51 is 0.03 µm or more, which is greater than the thickness of the gate insulation film $G_{OX}$. A word line (passing word line) WL of the adjacent memory cell is formed on each buried insulation film 51. For example, a passing word line WL<2> is formed on the buried insulation film 51 that is formed on the upper surface of the trench capacitor TC<03>. The passing word line WL<2> merely passes over the trench capacitor TC<03> and has no switching function for the memory cell MC<03>. In this manner, the word lines WL are provided such that active word lines and passing word lines are alternately arranged.

An isolation portion 6 is formed at a device isolation region 5 between the trench capacitors TC of memory cells MC that are formed along the bit line BL.

As is shown in FIG. 4, gate electrodes G <12> of polysilicon are formed on both side walls of the pillar FIN so as to sandwich the pillar FIN via the gate insulating film $G_{OX}$. In addition, a word line WL <2> comprising a polysilicon layer 52 and a silicided-polysilicon layer 52S is formed in contact with the upper surfaces of the gate electrodes G <12>. Furthermore, adjacent to the gate electrode G, trench capacitors TC are formed along the word line WL. A collar insulation film 47 is formed on an inner wall of the upper part of the trench capacitor TC. A buried insulating film 51 is formed on the upper surface of the trench capacitor TC. Furthermore, a word line WL is formed in contact with the collar insulation film 47 and buried insulation film 51. Accordingly, the gate electrode G is sandwiched between the gate insulating film $G_{OX}$ and collar insulating film 47. The thickness of the collar insulation film 47 is made greater than that of the gate insulating film $G_{OX}$.

An example of the basic operation of each memory cell MC will now be described, referring to the memory cell MC<03> by way of example. In the following description of the example of the basic operation, attention is paid to the variation in voltage of the bit line BL<0> in the read/write operation mode.

To begin with, the data read-out operation will be described. The bit line BL<0> is selected and precharged. The bit line BL<0> is thus activated. The precharge level of the bit line BL<0> is set at ½ (VDD/2) of the power supply voltage VDD that drives the sense amplifier for sensing the signal from, e.g. the bit line BL<0>.

Then, the word line WL for data read-out is selected. A positive potential is applied to the selected word line WL from a word line driver in a row decoder (not shown). For example, if the word line WL<3> is selected, the transistors with gate electrodes connected to the word line WL<3> are turned on. In FIG. 2, the gate electrode G<3> connected to the word line WL<3> is selected, and the transistor TR<03> is turned on.

Thereby, the bit line BL<0> at the precharge level is electrically connected to the storage node electrode 50 that is one of the electrodes of trench capacitor TC<03> of memory cell MC<03>.

At this time, if charge is accumulated in the trench capacitor TC<03> of memory cell MC<03>, charge is released to the bit line BL<0> from the trench capacitor TC<03> of memory cell MC<03>. As a result, the potential of the bit line BL<0> becomes higher than that of other bit lines set at the precharge level (VDD/2). On the other hand, if no charge is accumulated in the trench capacitor TC<03>, charge is supplied from the bit line BL<0> to the trench capacitor T<03> and is released. Thereby, the potential of the bit line BL<0> becomes lower than that of other bit lines set at the precharge level (VDD/2). The potential difference is sensed and amplified by the sense amplifier connected thereto, whereby "1" data or "0" data is read out. In this case, in accordance with the read-out "1" data or "0" data, "1" data or "0" data is rewritten in the trench capacitor TC<03> of memory cell MC<03> ("data refresh").

Next, the data write operation will be described. To start with, a VDD level or 0 V is applied from the sense amplifier to the bit line BL<0> in accordance with write data "1" or "0". If the word line WL<3> is selected, the transistor TR<03> is turned on and the bit line BL<0> is electrically connected to the storage electrode 50 of trench capacitor TC<03>.

Charge is accumulated in the trench capacitor TC<03> from the bit line BL<03> via the transistor TR<03>, or charge is released from the trench capacitor TC<03>. Thus, the write operation is performed. The same operation is performed for other memory cells MC.

According to the above structure, the same advantages as with the first embodiment are obtained. In addition, the fin-gate-type double-gate transistor is used as the cell transistor TS1 of each memory cell MC. In the fin-gate-type double-gate transistor, channels are formed on both sides of the pillar, as mentioned above. Thereby, the current density and off-leak current are reduced, and this is advantageous for miniaturization.

By virtue of the cap structure 75, the capacitor insulation film 70 is sealed in the trench capacitor. This prevents direct contact between the capacitor insulation film 70 and surface strap ST. It is possible, therefore, to prevent the high-dielectric-constant material from diffusing into the surface strap ST. As a result, a junction leak due to diffusion of the high-dielectric-constant material can be suppressed, and the retention characteristics (charge retention characteristics) can be enhanced.

On the other hand, the cap structure 75 has a less thickness at the central part than at the peripheral part. This reduces contact resistance between the storage node electrode 50 and surface strap ST. Therefore, the switching characteristics can be enhanced. As described above, since the cap structure 75 has a greater thickness at the peripheral part than at the central part, the retention characteristics can be enhanced and the switching characteristics improved.

The cap structure 75 according to this embodiment has a concave cross section. This cross section is advantageous in preventing diffusion of the storage node electrode 50 into the surface strap ST. The retention characteristics can thus be enhanced.

Since each of the word line WL, surface strap ST and bit line contact BC has the double-layer structure comprising the polysilicon layer and high-melting-point metal silicide layer, the silicide layer can reduce the resistance value.

As is shown in FIG. 3 and FIG. 4, the surface of the buried insulation film 51, which is a part of the trench capacitor TC, projects higher than the major surface of the pillar FIN that is formed at the semiconductor substrate 11. Thus, the distance between the source S of the cell transistor and the capacitor insulation film 70 and storage node electrode 50 can further be increased. Therefore, the retention characteristics are more advantageously enhanced.

A method of fabricating the semiconductor device according to the embodiment of the invention will now be described. Specifically, a method of fabricating the memory cell having the fin-gate type double-gate transistor and trench capacitor shown in FIGS. 2 to 5 will be described by way of example. In the description below, FIGS. 6A through 30A and FIGS. 6B through 30B are referred to.

FIGS. 6A to 30A are cross-sectional views taken along line 4—4 in FIG. 2, illustrating manufacturing steps in succession. FIGS. 6B to 30B are cross-sectional views taken along line 3—3 in FIG. 2, illustrating manufacturing steps in succession.

To start with, as shown in FIG. 6A and FIG. 6B, a silicon oxide film 12 with a thickness of about 2 nm is formed by, e.g. thermal oxidation, on a major surface of a semiconductor substrate (P-type silicon substrate in this example) 11. The silicon oxide film 12 may be an oxide film formed by a chemical process with a different composition. A silicon nitride film 30 with a thickness of about 70 nm is deposited on the silicon oxide film 12 by, e.g. CVD (Chemical Vapor Deposition). A TEOS-SiO$_2$ film 31 with a thickness of about 550 nm is formed on the silicon nitride film 30 by CVD using TEOS (Tetra Ethyl Ortho Silicate) as a reaction gas. A hard mask film 32 with a thickness of about 300 nm, which is comprised essentially of an insulating film, is formed on the TEOS-SiO$_2$ film 31. An SOG (Spin on Glass) film 33 with a thickness of about 10 nm is deposited on the hard mask film 32. The hard mask film 32 and SOG film 33 serve to exactly form a trench in the TEOS-SiO$_2$ film 31, as will be described later. A photoresist 34 is coated on the SOG film 33, and is subjected to exposure and development. Thus, the photoresist 34 is patterned to form a device isolation region (STI: Shallow Trench Isolation). The width of the device isolation region is, e.g. about 90 nm to 110 nm, and the device isolation regions are arranged at intervals of 90 nm to 110 nm.

Using the photoresist 34 as a mask, as shown in FIG. 7A and FIG. 7B, the SOG film 33, hard mask film 32 and TEOS-SiO$_2$ film 31 are anisotropically etched by, e.g. RIE (Reactive Ion Etching). Then, the SOG film 33 and photoresist 34 are removed.

Figure 8A:
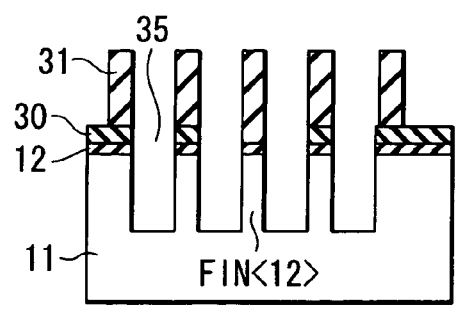
FIG. 8A illustrates a fabrication step of the semiconductor memory device according to the second embodiment of the invention, FIG. 8A being a cross-sectional view taken along line 4—4 in FIG. 2.
Figure 8B:
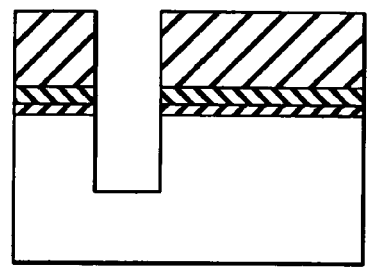
FIG. 8B illustrates a fabrication step of the semiconductor memory device according to the second embodiment of the invention, FIG. 8B being a cross-sectional view taken along line 3—3 in FIG. 2.

Then, as shown in FIGS. 8A and 8B, using the remaining hard mask film 32 and TEOS-SiO$_2$ film 31 as a mask, a trench 35 with a width of about 30 nm to 130 nm and a depth of about 250 nm is formed by anisotropical etching, e.g. RIE, in the silicon nitride film 30, silicon oxide film 12 and silicon substrate 11. Through the steps of forming the trench 35, a projecting semiconductor region (width: about 20 nm to 110 nm), which will become the pillar FIN<12> of memory cell MC<12>, is formed on the major surface of silicon substrate 11.

Figure 9A:
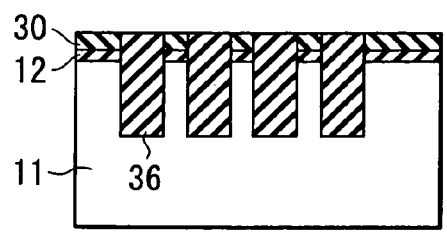
FIG. 9A illustrates a fabrication step of the semiconductor memory device according to the second embodiment of the invention, FIG. 9A being a cross-sectional view taken along line 4—4 in FIG. 2.
Figure 9B:
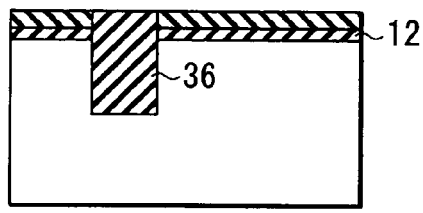
FIG. 9B illustrates a fabrication step of the semiconductor memory device according to the second embodiment of the invention, FIG. 9B being a cross-sectional view taken along line 3—3 in FIG. 2.

An oxide film (not shown) is formed by, e.g. thermal oxidation, on an inner wall of the trench 35. Further, as shown in FIGS. 9A and 9B, an SiO$_2$ film is buried by, e.g. CVD, and then the surface is planed by CMP (Chemical Mechanical Polishing). Through the above steps, an STI region 36 is formed in the trench 35.

Figure 10A:
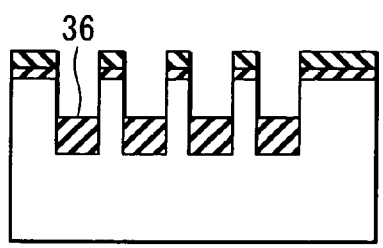
FIG. 10A illustrates a fabrication step of the semiconductor memory device according to the second embodiment of the invention, FIG. 10A being a cross-sectional view taken along line 4—4 in FIG. 2.
Figure 10B:
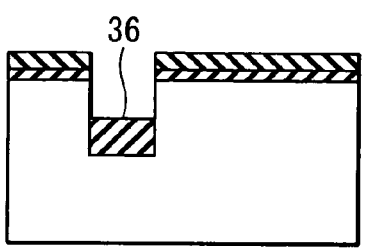
FIG. 10B illustrates a fabrication step of the semiconductor memory device according to the second embodiment of the invention, FIG. 10B being a cross-sectional view taken along line 3—3 in FIG. 2.

Next, as shown in FIGS. 10A and 10B, the STI region 36 of the memory cell array is etched back by, e.g. wet etching, by a depth of about 150 nm. At this time, the thickness of the STI region 36 that is left on the bottom of the trench is about 30 nm.

Thereafter, by means of, e.g. ion implantation, phosphorus (P) is implanted twice in different oblique directions in the side walls of the silicon substrate 11 at the upper part of the STI region 36 in the memory cell array. This implantation step can be carried out before recessing the STI region 36. In such a case, ions are vertically implanted, and then a gate insulating film G$_{OX}$ with a thickness of about 5 nm is formed by, e.g. thermal oxidation (not shown). Further, the resultant is nitrided in a nitrogen atmosphere or a plasma atmosphere and then annealed.

Figure 11A:
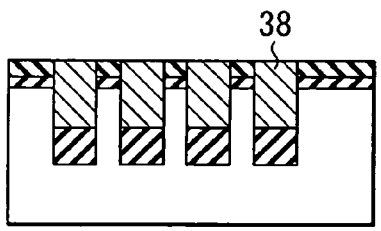
FIG. 11A illustrates a fabrication step of the semiconductor memory device according to the second embodiment of the invention, FIG. 11A being a cross-sectional view taken along line 4—4 in FIG. 2.
Figure 11B:
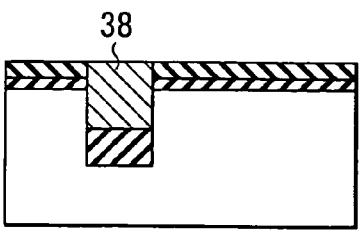
FIG. 11B illustrates a fabrication step of the semiconductor memory device according to the second embodiment of the invention, FIG. 11B being a cross-sectional view taken along line 3—3 in FIG. 2.

Thereafter, as shown in FIGS. 11A and 11B, a polysilicon layer 38 is deposited over the entire surface by, e.g. CVD. Further, the polysilicon layer 38 is planed by, e.g. CMP and buried in the trench 35. Thus, a gate electrode is formed. Subsequently, an oxide film is deposited on the entire surface of the substrate 11, for example, in a low-pressure atmosphere in which O$_2$ and H$_2$ are burnt, or in an ozone-containing atmosphere (not shown).

Figures 12A, 12B:
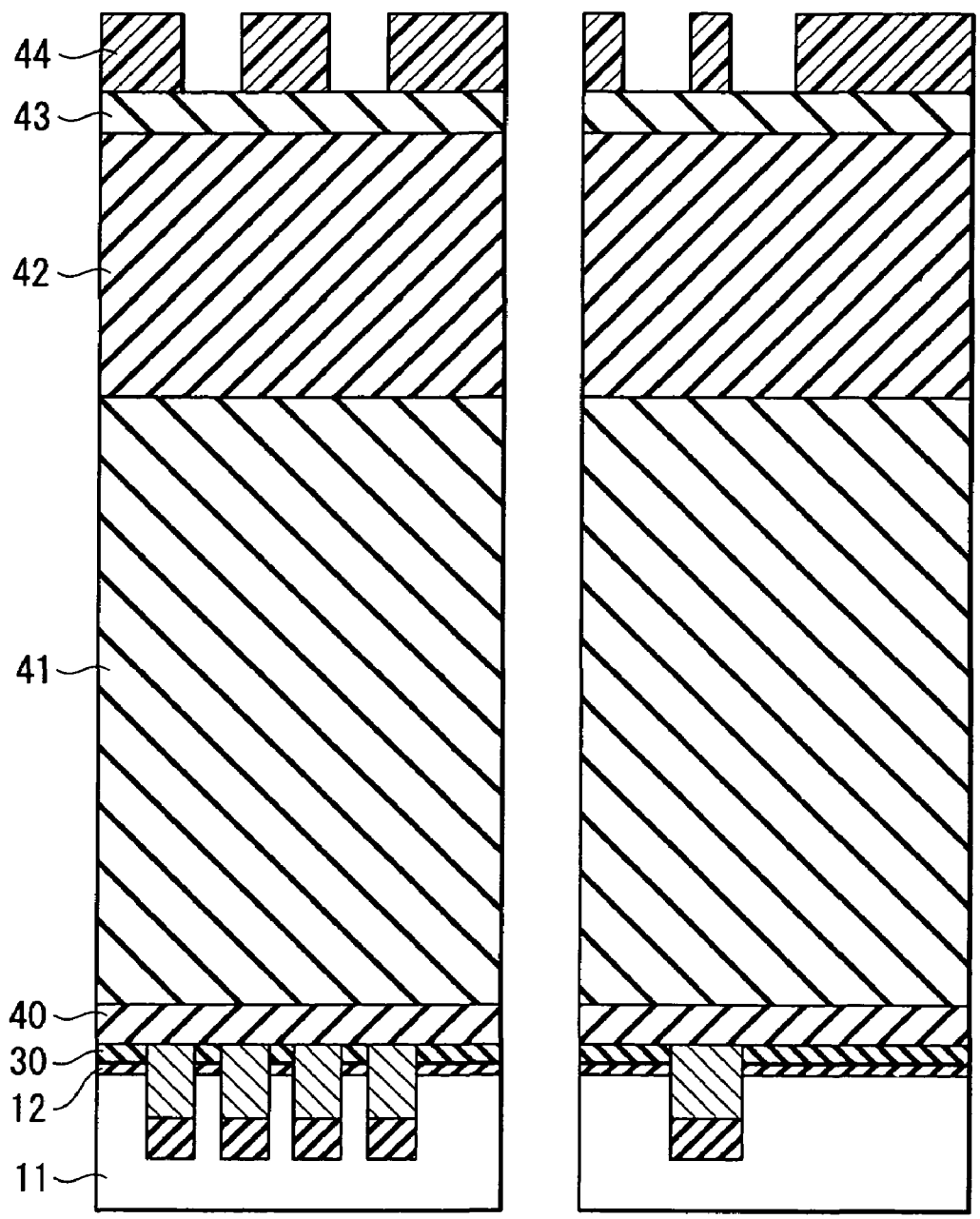
FIG. 12A illustrates a fabrication step of the semiconductor memory device according to the second embodiment of the invention, FIG. 12A being a cross-sectional view taken along line 4—4 in FIG. 2.
FIG. 12B illustrates a fabrication step of the semiconductor memory device according to the second embodiment of the invention, FIG. 12B being a cross-sectional view taken along line 3—3 in FIG. 2.

Over the entire surface, as shown in FIG. 12A and FIG. 12B, a silicon nitride film 40 with a thickness of about 100 nm, a BSG film 41 with a thickness of about 1600 nm serving as a mask material, a hard mask film 42 with a thickness of about 700 nm and an SOG film 43 with a thickness of about 10 nm are deposited in succession. A photoresist 44 is coated on the SOG film 43, and the photoresist 44 is subjected to exposure and development. Thus, a mask patterning for forming a deep trench is formed. The hard mask film 42 and SOG film 43 are deposited in order to exactly etch the BSG film 41.

Figures 13A, 13B:
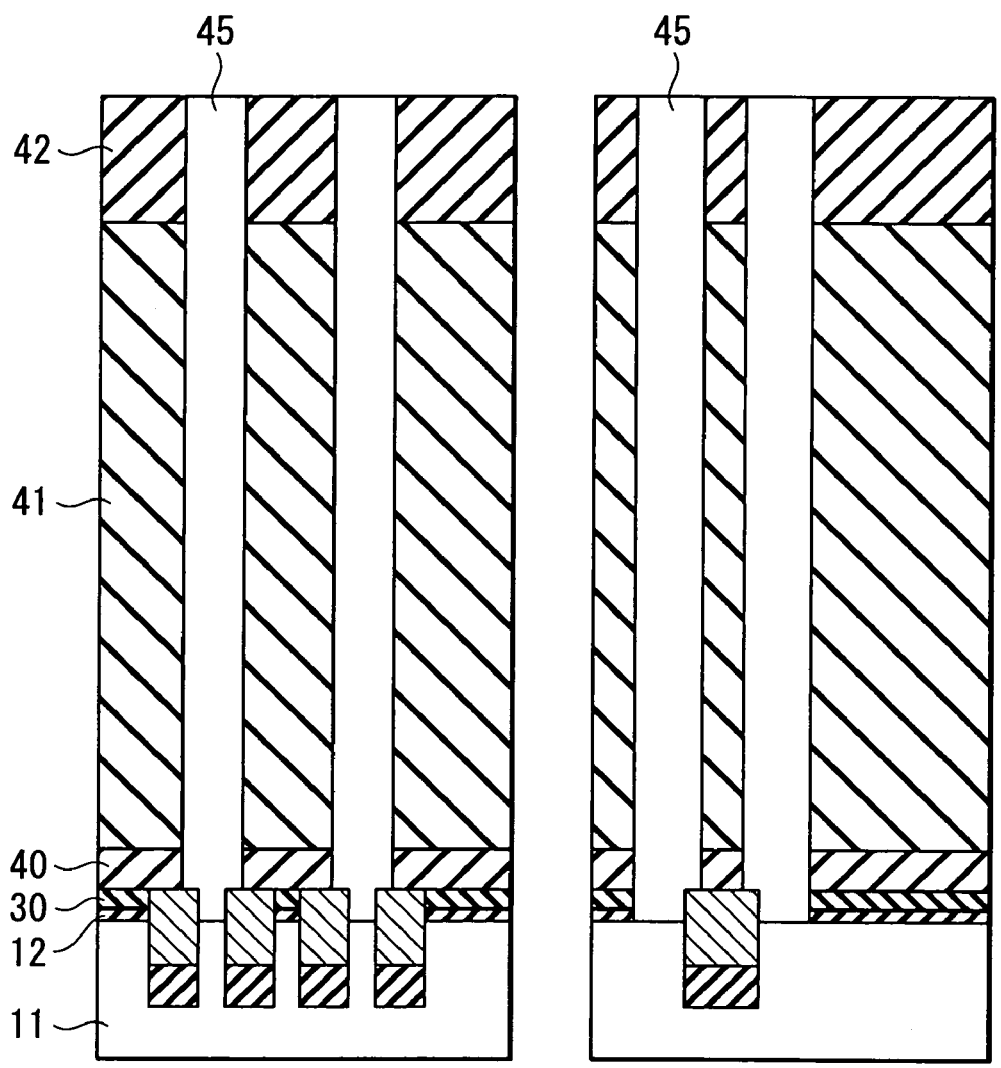
FIG. 13A illustrates a fabrication step of the semiconductor memory device according to the second embodiment of the invention, FIG. 13A being a cross-sectional view taken along line 4—4 in FIG. 2.
FIG. 13B illustrates a fabrication step of the semiconductor memory device according to the second embodiment of the invention, FIG. 13B being a cross-sectional view taken along line 3—3 in FIG. 2.

Using the photoresist 44 as a mask, the SOG film 43, hard mask film 42, BSG film 41, silicon nitride film 40, silicon nitride film 30 and silicon oxide film 12 are successively etched by anisotropic etching, e.g. RIE, as shown in FIG. 13A and FIG. 13B. Thereby, a trench 45 serving as a mask for forming the deep trench is formed. The photoresist 44 and SOG film 43 are removed. In this step, by virtue of an oxide film (not shown) formed between the silicon nitride film 30 and the silicon nitride film 40, only the silicon nitride film 40 can selectively be removed.

Figures 14A, 14B:
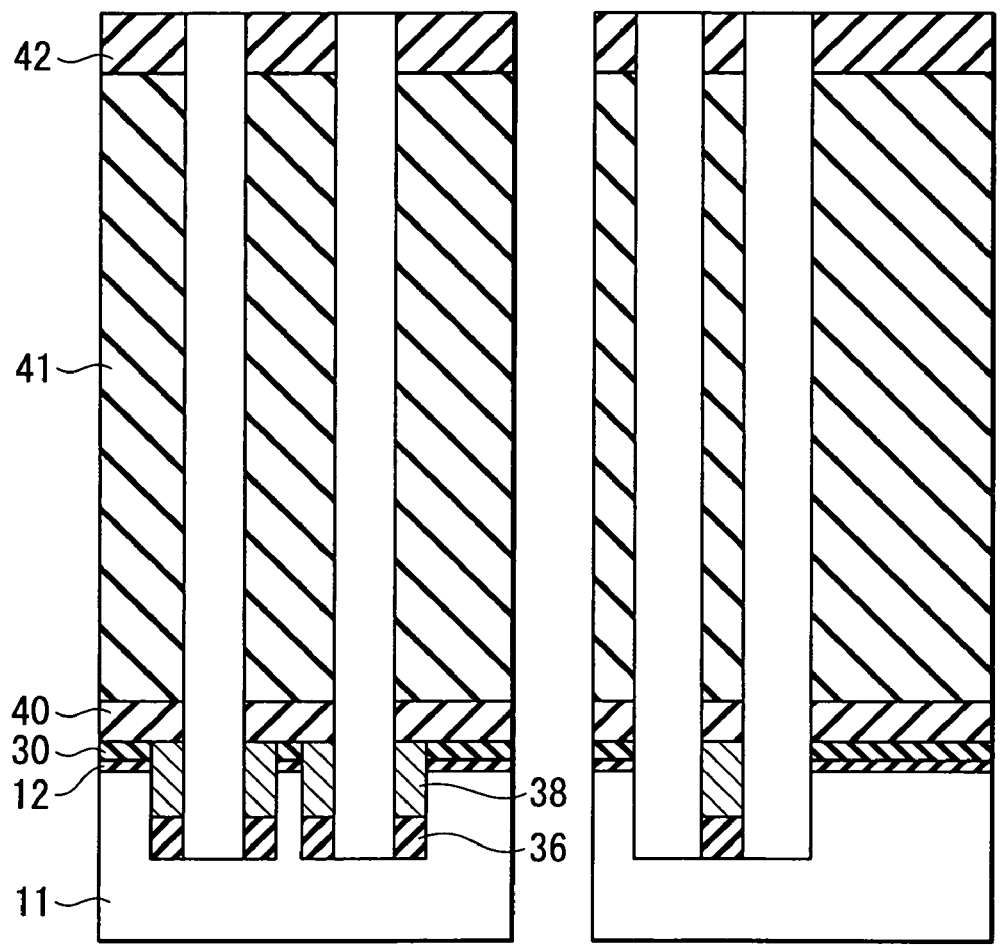
FIG. 14A illustrates a fabrication step of the semiconductor memory device according to the second embodiment of the invention, FIG. 14A being a cross-sectional view taken along line 4—4 in FIG. 2.
FIG. 14B illustrates a fabrication step of the semiconductor memory device according to the second embodiment of the invention, FIG. 14B being a cross-sectional view taken along line 3—3 in FIG. 2.

Then, as shown in FIGS. 14A and 14B, the polysilicon layer 38 and STI region 36 are etched by, e.g. a low-selection-ratio etching method.

Figures 15A, 15B:
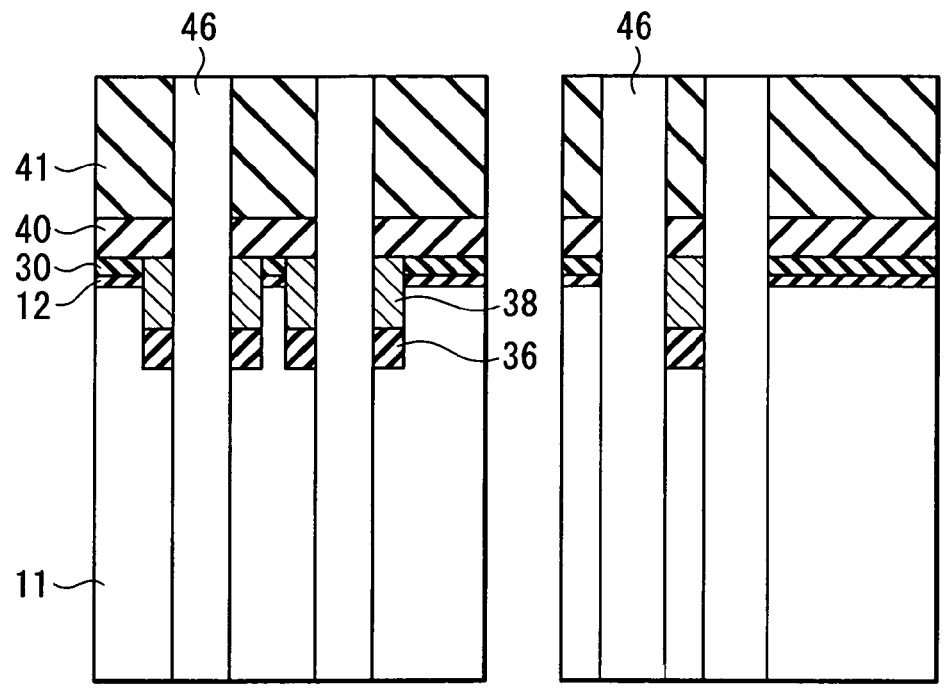
FIG. 15A illustrates a fabrication step of the semiconductor memory device according to the second embodiment of the invention, FIG. 15A being a cross-sectional view taken along line 4—4 in FIG. 2.
FIG. 15B illustrates a fabrication step of the semiconductor memory device according to the second embodiment of the invention, FIG. 15B being a cross-sectional view taken along line 3—3 in FIG. 2.

Subsequently, as shown in FIGS. 15A and 15B, the silicon substrate 11 is etched by anisotropic etching, e.g. RIE, and a deep trench 46 with a depth of, e.g. about 6 μm is formed. Thereafter, post-cleaning is performed.

Figures 16A, 16B:
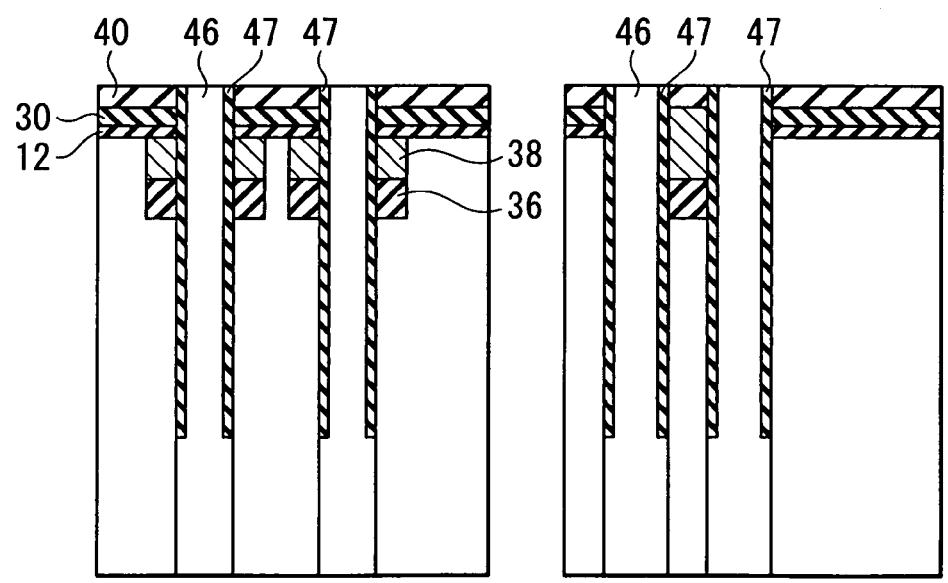
FIG. 16A illustrates a fabrication step of the semiconductor memory device according to the second embodiment of the invention, FIG. 16A being a cross-sectional view taken along line 4—4 in FIG. 2.
FIG. 16B illustrates a fabrication step of the semiconductor memory device according to the second embodiment of the invention, FIG. 16B being a cross-sectional view taken along line 3—3 in FIG. 2.

Following the above, as shown in FIGS. 16A and 16B, the hard mask film 42 and BSG film 41 are removed. Further, an amorphous silicon film (not shown) with a thickness of about 200 Å is deposited by CVD, and an oxide film with a thickness of about 30 Å is formed on the surface of the amorphous silicon film by thermal oxidation. In addition, an oxide film with a thickness of about 100 Å is formed by, e.g. LOCOS (Local Oxidation of Silicon), at only an upper part of the deep trench 46. Thus, a collar insulation film 47 is formed.

Figure 17A:
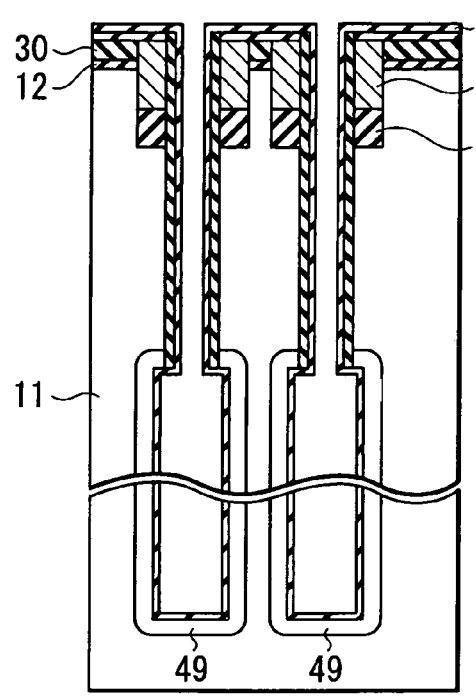
FIG. 17A illustrates a fabrication step of the semiconductor memory device according to the second embodiment of the invention, FIG. 17A being a cross-sectional view taken along line 4—4 in FIG. 2.
Figure 17B:
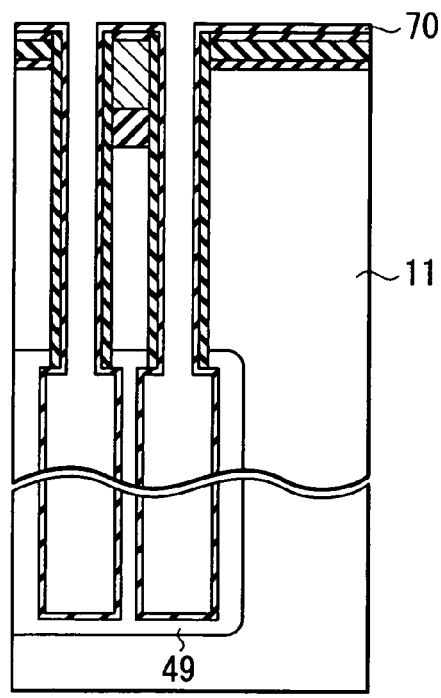
FIG. 17B illustrates a fabrication step of the semiconductor memory device according to the second embodiment of the invention, FIG. 17B being a cross-sectional view taken along line 3—3 in FIG. 2.

The semiconductor substrate 11 at the bottom part of the deep trench 46 is etched by, e.g. CDE (Chemical Dry Etching), as shown in FIGS. 17A and 17B, and the bottom part of the deep trench 46 is formed in a bottle shape. By forming the bottom part of the trench in the bottle shape, the surface area of the trench can be increased and the capacitance of the capacitor can be increased. Depiction of the entire bottom part of the trench is omitted because it has a high aspect ratio.

Further, arsenic (As) or phosphorus (P) is adsorbed or diffused in that part of the semiconductor substrate 11, which contacts the inside of the trench 46, by gas-phase doping, and an N$^+$ diffusion region is formed as a buried region. Thus, a plate electrode 49 is formed. Over the entire surface including the inside of the trench, an Al$_2$O$_3$ film is deposited by, e.g. ALD (Atomic Layer Deposition). In this step, as shown in FIG. 17A and FIG. 17B, the Al$_2$O$_3$ film at the upper part of the trench is formed along the collar insulation film 47. The Al$_2$O$_3$ film is annealed at temperatures of 700° C. or above and crystallized. Thus, a capacitor insulation film 70 extending along the inner wall of the trench is formed.

Figure 18A:
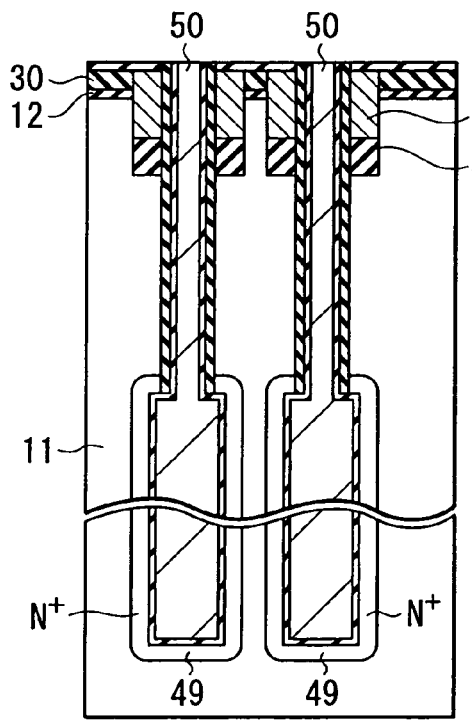
FIG. 18A illustrates a fabrication step of the semiconductor memory device according to the second embodiment of the invention, FIG. 18A being a cross-sectional view taken along line 4—4 in FIG. 2.
Figure 18B:
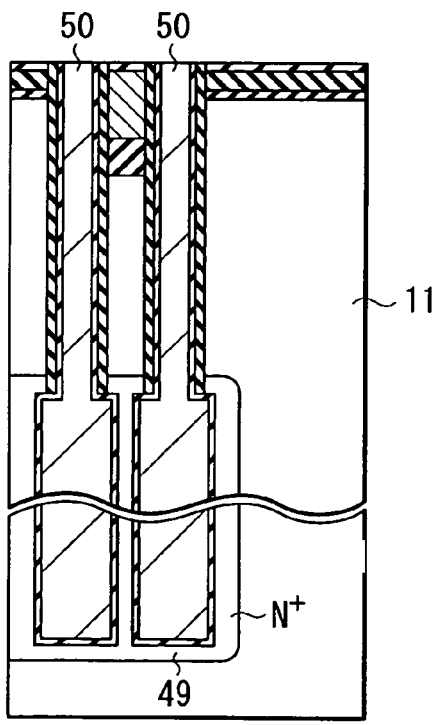
FIG. 18B illustrates a fabrication step of the semiconductor memory device according to the second embodiment of the invention, FIG. 18B being a cross-sectional view taken along line 3—3 in FIG. 2.

Then, as shown in FIGS. 18A and 18B, polysilicon, for instance, is buried in the trench, and thus a storage node electrode 50 is formed. In this case, the storage node electrode 50 may be formed of, e.g. buried metal, for example, by depositing TiN, etc. in the trench by CVD. Thereafter, the upper surface of the resultant structure is planed by, e.g. CMP.

Next, as shown in FIGS. 19A and 19B, the storage node electrode 50 at the upper part of the trench is recessed by anisotropic etching, e.g. RIE, by about 500 Å. In addition, the capacitor insulation film 70 at the upper part of the trench is recess by wet etching using, e.g. hot phosphoric acid, such that the upper surface of the capacitor insulation film 70 becomes substantially flush with the upper surface of the storage node electrode 50. Thus, the capacitor insulation film 70 and storage node electrode 50 at the upper part of the trench are removed. In the wet etching step, the degree of recessing of the capacitor insulation film 70 is decreased to a minimum by selecting an etchant, etc., that has a lower etching rate for the storage node electrode 50 than for the collar insulation film 47.

In a subsequent step illustrated in FIGS. 20A and 20B, a polysilicon film 81 is deposited by, e.g. CVD, over the entire surface. Further, a resist 82 is coated over the entire surface.

Figures 21A, 21B:
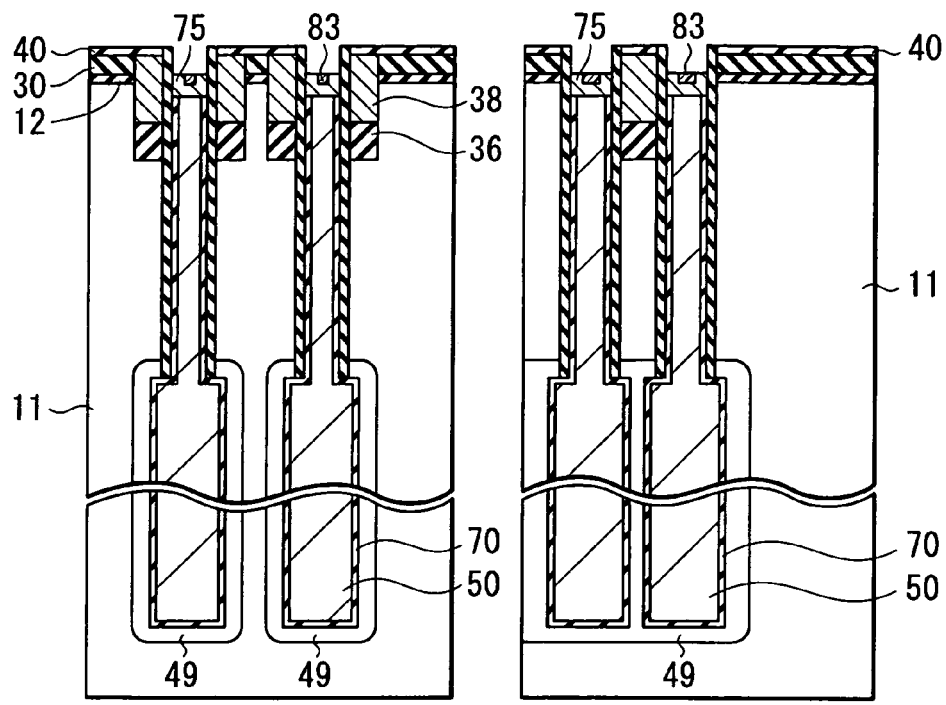
FIG. 21A illustrates a fabrication step of the semiconductor memory device according to the second embodiment of the invention, FIG. 21A being a cross-sectional view taken along line 4—4 in FIG. 2.
FIG. 21B illustrates a fabrication step of the semiconductor memory device according to the second embodiment of the invention, FIG. 21B being a cross-sectional view taken along line 3—3 in FIG. 2.

Then, as shown in FIGS. 21A and 21B, the polysilicon film 81 and resist 82 are etched by, e.g. a resist recess method, and a cap structure 75 with a concave cross section is formed on the capacitor insulation film 70 and storage node electrode 50. Thereafter, the resist 83 that is left in a groove portion of the cap structure 75 is removed.

Figures 22A, 22B:
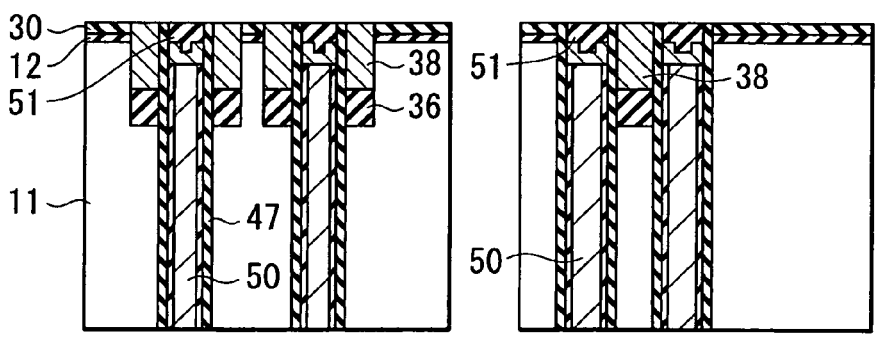
FIG. 22A illustrates a fabrication step of the semiconductor memory device according to the second embodiment of the invention, FIG. 22A being a cross-sectional view taken along line 4—4 in FIG. 2.
FIG. 22B illustrates a fabrication step of the semiconductor memory device according to the second embodiment of the invention, FIG. 22B being a cross-sectional view taken along line 3—3 in FIG. 2.

Over the entire surface, a buried insulating film (TTO (Trench Top Oxide)) 51 of TEOS-SiO$_2$ is deposited by about 200 nm by CVD using, e.g. TEOS as a reaction gas. Then, as shown in FIGS. 22A and 22B, part of the buried insulating film 51 and silicon nitride film 40 are removed by, e.g. CMP, and the surface of the resultant structure is polished until the upper surface of the polysilicon layer 38 will be exposed.

Figures 23A, 23B:
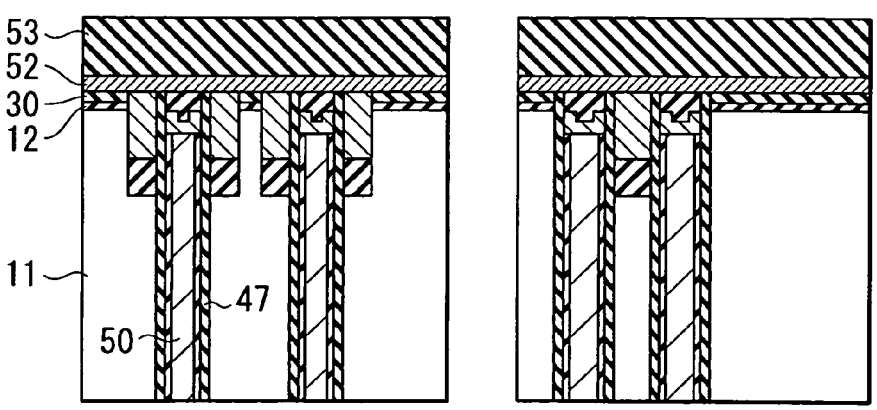
FIG. 23A illustrates a fabrication step of the semiconductor memory device according to the second embodiment of the invention, FIG. 23A being a cross-sectional view taken along line 4—4 in FIG. 2.
FIG. 23B illustrates a fabrication step of the semiconductor memory device according to the second embodiment of the invention, FIG. 23B being a cross-sectional view taken along line 3—3 in FIG. 2.

An undoped polysilicon layer 52 with a thickness of about 70 nm is deposited over the entire surface, as shown in FIGS. 23A and 23B. Boron (B), for instance, is doped in the polysilicon layer 52 by ion implantation under conditions of 5 keV with $2 \times 10^{15}/cm^3$. Further, a BSG film 53 with a thickness of about 150 nm serving as a cap layer is deposited on the polysilicon layer 52.

A part of the word line WL serving as the gate electrode of the cell transistor of the memory cell MC is then formed. A photoresist (not shown) is coated on the BSG film 53. The photoresist is subjected to exposure and development, thus forming a desired pattern. Using the photoresist as a mask, anisotropic etching is performed by, e.g. RIE. By the anisotropic etching, the polysilicon layer 52, BSG film 53 and polysilicon layer 38 are etched, as shown in FIGS. 24A and 24B, thereby forming a part of the word line WL. The device isolation region 5, from which the polysilicon layer 38 is removed, serves to isolate the trench capacitors TC that are adjacent along the bit line BL. In the manufacturing step in this embodiment, the part of the word line WL serving as the gate electrode, the bit line contact BC and the device isolation region 5 are formed at a time. Since line-and-space photoresist patterns can be used, the manufacturing cost can be reduced and a higher integration density can be achieved.

Thereafter, impurity ions of a conductivity type opposite to the conductivity type of the silicon substrate 11, e.g. phosphorus (P) or arsenic (As), are ion-implanted and diffused by annealing. Thus, the source region S and drain region D of the transistor are formed.

Then, as shown in FIGS. 25A and 25B, a silicon nitride film 59 that becomes a part of a spacer is deposited on the entire surface by, e.g. CVD, and it is etched by anisotropic etching, e.g. RIE. As a result, the surface of the semiconductor substrate 11, on which the source S and drain D are formed, is exposed, and a gate insulation film (silicon nitride film 30 and silicon oxide film 12) and a part of the spacer are formed. Further, a barrier silicon nitride film 60 is deposited on the entire surface by CVD, and a gate electrode spacer is formed. A BPSG film 61 is deposited on the device isolation region 5 between the trench capacitors TC that are adjacent along the bit line BL.

Subsequently, as shown in FIGS. 26A and 26B, the entire surface is subjected to anisotropic etching, e.g. RIE, and parts of the barrier silicon nitride film 60, BPSG film 61 and buried insulating film 51 are removed. By this step, the surface of the semiconductor substrate 11, on which the source S and drain D are formed, and the part of the cap structure 75, are exposed. With the partial removal of the buried insulating film 51, a conduction path is formed between the storage node electrode 50 of the trench capacitor TC and the surface strap that is to be formed later. Following this step, an LDD (Lightly Doped Drain) structure may be formed by ion-implanting phosphorus (P) or arsenic (As), which is of a conductivity type opposite to the conductivity type of the semiconductor substrate 11, and diffusing it by annealing.

Then, as shown in FIGS. 27A and 27B, a doped polysilicon layer 63 is deposited over the entire surface by, e.g. LPCVD (Low Pressure Chemical Vapor Deposition). With this step, a part of the surface strap ST, which electrically connects the source S of the cell transistor and the storage node electrode 50, and a part of the bit line contact BC, which electrically connects the drain D and the bit line BL, are formed. Further, the polysilicon layer 63 is also deposited on the device isolation region 5.

Next, as illustrated in FIGS. 28A and 28B, the BSG film 53 that is formed on the polysilicon layer 52 is removed.

Then, as shown in FIGS. 29A and 29B, through silicide processes, the polysilicon layer 52 and a high-melting-point metal layer are reacted to form a silicide layer 52S on the polysilicon layer 52. Thus, the word line WL is formed. At the same time, the polysilicon layer 63 and a high-melting-point metal layer are reacted to form a silicide layer 63S on the polysilicon layer 63. Thus, the surface strap St is formed. In this way, the surface of each polysilicon layer is silicided, thereby reducing the wiring resistance. Moreover, the simultaneous fabrication can reduce the manufacturing cost.

Figure 30A:
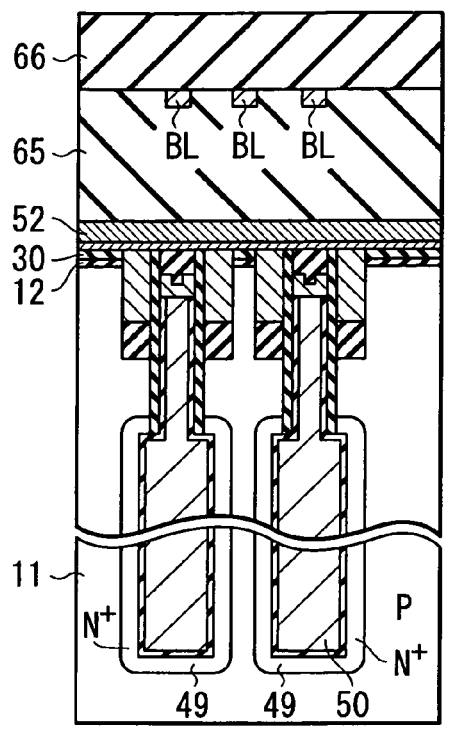
FIG. 30A illustrates a fabrication step of the semiconductor memory device according to the second embodiment of the invention, FIG. 30A being a cross-sectional view taken along line 4—4 in FIG. 2.
Figure 30B:
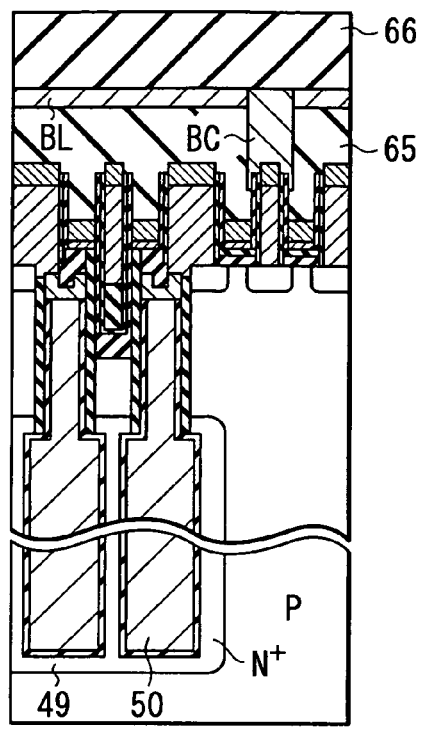
FIG. 30B illustrates a fabrication step of the semiconductor memory device according to the second embodiment of the invention, FIG. 30B being a cross-sectional view taken along line 3—3 in FIG. 2.

Thereafter, as shown in FIGS. 30A and 30B, a silicon nitride film, etc. is deposited on the entire surface, and an interlayer insulation film 65 is formed. Further, a photoresist is coated on the entire surface, and the photoresist is subjected to exposure and development to form a desired pattern (not shown) for forming bit lines BL. Using the photoresist as a mask, anisotropic etching, e.g. RIE, is conducted to form grooves in the interlayer insulation film 65. Polysilicon, for instance, is buried in the grooves, thereby forming bit lines BL.

Subsequently, anisotropic etching, e.g. RIE, is performed to form through-holes that penetrate the bit line BL and silicon nitride film 65. By forming buried plugs in the through-holes, a bit line contact BC is formed. Further, a silicon nitride film is deposited by, e.g. CVD, over the entire surface, thus forming an interlayer insulation film 66.

Through the above-described steps, the semiconductor memory device as shown in FIGS. 2 to 5 is obtained.

According to the above-described manufacturing method of this embodiment, the trench capacitor TC is first formed, following which the cell transistor TR is formed. In general, the high-dielectric-constant film that is used as the capacitor insulation film 70 tends to suffer thermal damage. In addition, the step of forming the cell transistor, for instance, the step of forming the silicon nitride film 60, 59, which becomes the spacer, requires processing at higher temperatures. Thus, the high-dielectric-constant film can be protected against thermal processing, and the retention characteristics can be enhanced.

The collar insulation film 47 is formed by LOCOS. Since the collar insulation film 47 is formed by LOCOS, as described above, the collar insulation film 47 can easily be formed at a shallow upper part of the trench.

Further, as shown in FIGS. 16A to 19A and FIGS. 16B to 19B, after the collar insulation film 47 is formed, the high-dielectric-constant film (e.g. $Al_2O_3$ film) is formed over the entire surface including the inside of the trench. Specifically, the collar insulation film 47 is formed prior to the formation of the high-dielectric-constant film, and the high-dielectric-constant film is formed along the collar insulation film 47 at the upper part of the trench. Then, the high-dielectric-constant film is crystallized by annealing with an adequate time, temperature, etc., which are selected for crystallizing the high-dielectric-constant film. The capacitor insulation film 70 is thus formed. Thereafter, the high-dielectric-constant film that is crystallized at the upper part of the trench is removed by, e.g. wet etching.

As has been described above, the high-dielectric-constant film can be crystallized by annealing. In order to obtain satisfactory retention characteristics, the step of sufficiently crystallizing the high-dielectric-constant material is indispensable. Hence, the retention characteristics are improved.

On the other hand, in general, it is very difficult to remove, by wet etching, etc., the sufficiently crystallized high-dielectric-constant film. However, since the crystallized high-dielectric-constant film at the upper part of the trench is formed along the collar insulation film 47, the high-dielectric-constant film at the upper part of the trench can easily be removed by wet etching, etc. It is thus possible to prevent high-dielectric-constant material contained in the high-dielectric-constant film, which is left at the upper part of the trench, from diffusing into the cell transistor, etc. and degrading the retention characteristics. Therefore, the retention characteristics can be enhanced.

As described above, the high-dielectric-constant film can sufficiently be crystallized, and the crystallized high-dielectric-constant film at the upper part of the trench can easily be removed.

Additionally, as shown in FIGS. 20A and 21A and FIGS. 20B and 21B, the polysilicon film 81 is deposited over the entire surface by, e.g. CVD. The resist 82 is then coated over the entire surface. The polysilicon film 81 and resist 82 are etched by the resist recess method, etc., and the cap structure 75 with the concave cross section is formed on the capacitor insulation film 70 and storage node electrode 50. Further, the resist 83 that is left in the groove of the cap structure 75 is removed.

By the above-described steps, the cap structure 75 with the concave cross section can easily be formed. Since the cap structure 75 has the concave cross section, the high-dielectric-constant material in the capacitor insulation film 70 can be prevented from diffusing into the surface strap ST, etc. Therefore, the retention characteristics can be improved.

Besides, the word line WL, surface strap ST and bit line contact BC can be silicided at the same time. Therefore, the fabrication steps can be simplified and the manufacturing cost can be reduced.

Since the surface strap ST is provided, ions are implanted deeper in the pillar FIN and the pillar FIN is not damaged. If the surface strap ST is not used for connection, it is necessary to directly connect the source region and the trench capacitor TC. In this case, the diffusion region that becomes the source region needs to be formed deeper in the pillar FIN by ion-implantation. Consequently, the pillar FIN may be damaged in the ion-implantation step.

[Third Embodiment]

Next, a semiconductor memory device according to a third embodiment of the present invention and a method of manufacturing the semiconductor memory device will now be described with reference to FIGS. 31 through 35. In the description below, the parts common to those in the second embodiment are not described.

Figure 31:
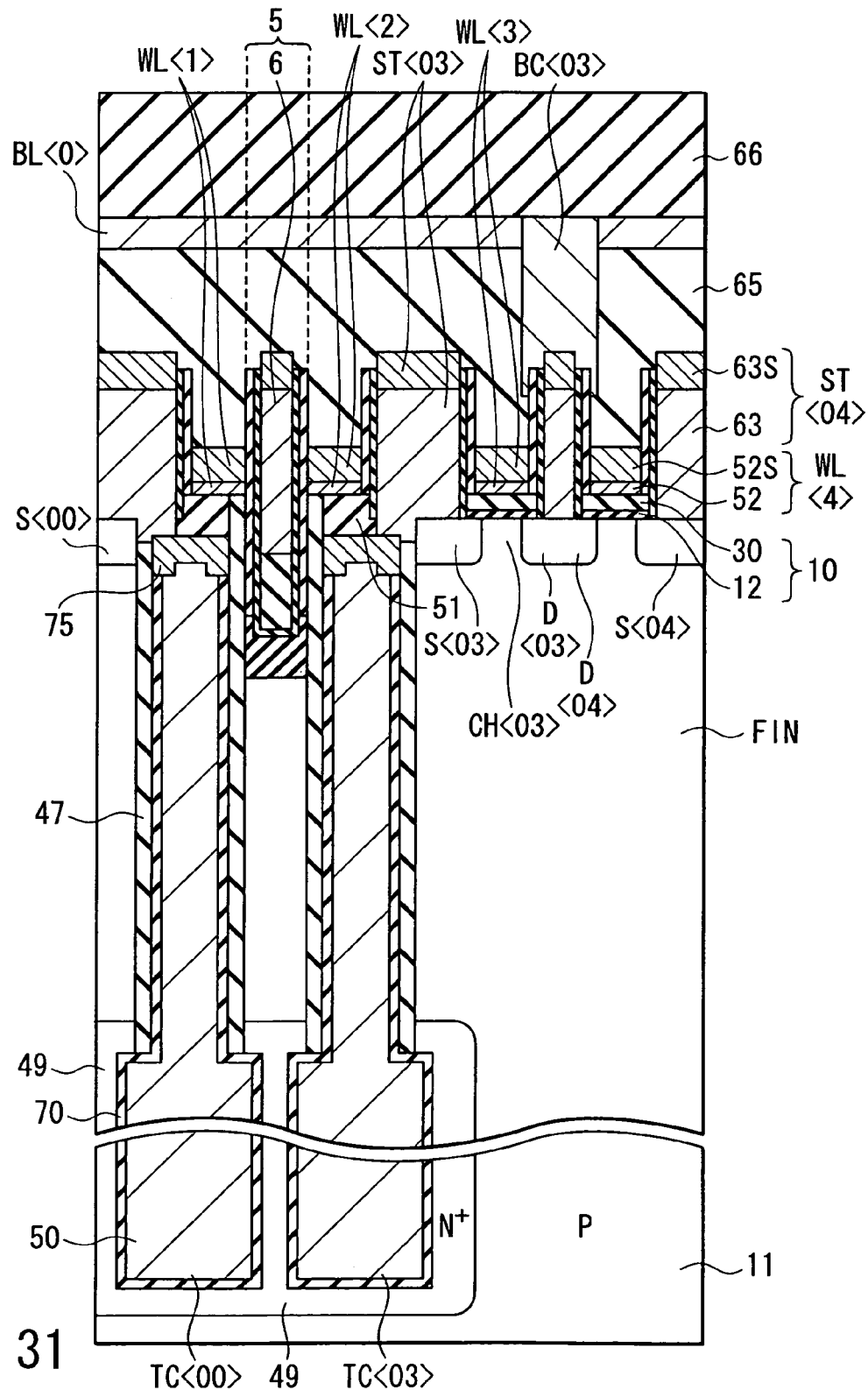
FIG. 31 is a view for describing a semiconductor memory device according to a third embodiment of the present invention, FIG. 31 being a cross-sectional view schematically illustrating a DRAM memory cell using a fin-gate-type double-gate transistor.
Figure 32:
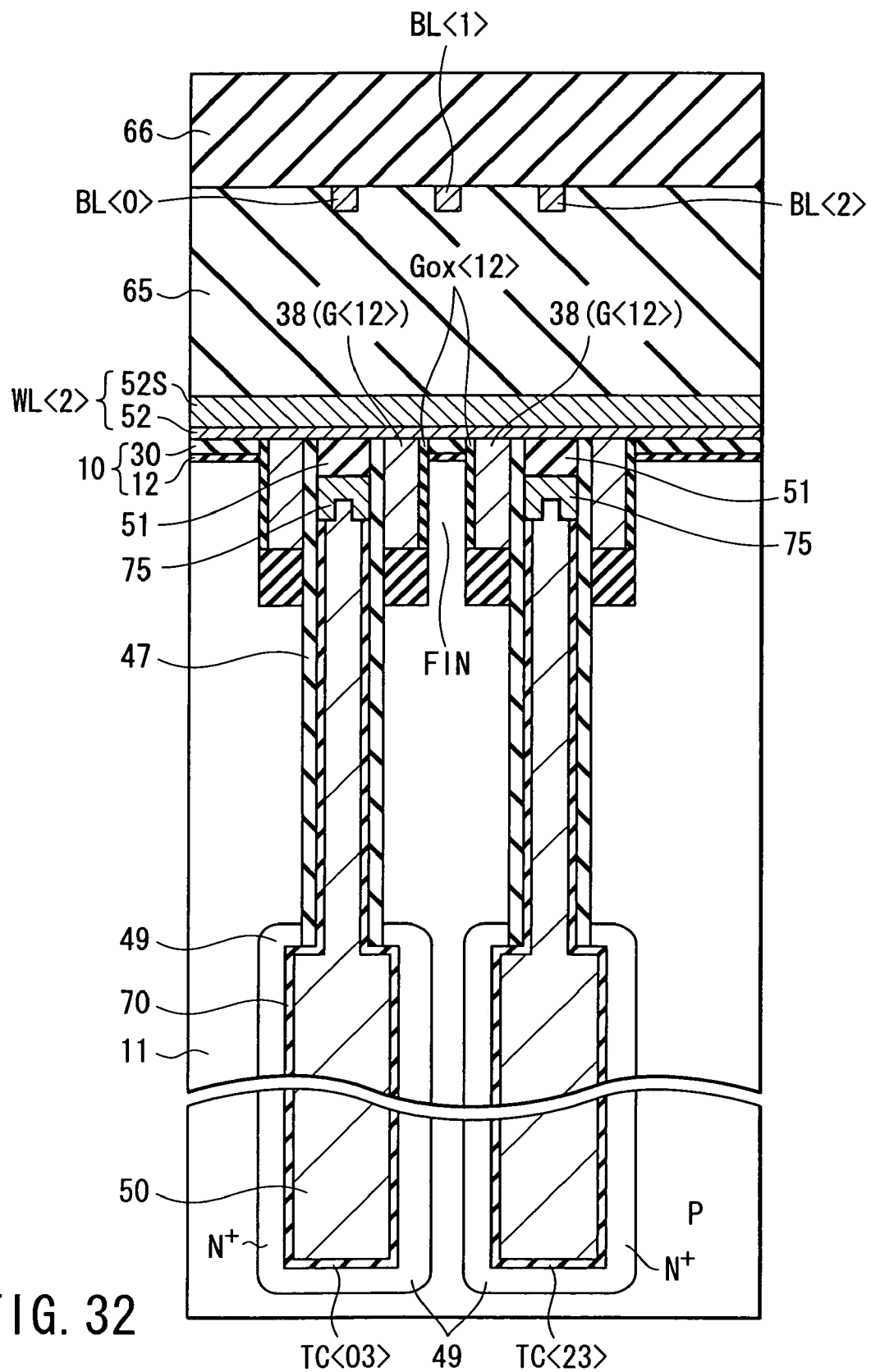
FIG. 32 is a view for describing the semiconductor memory device according to the third embodiment of the present invention, FIG. 32 being a cross-sectional view schematically illustrating the DRAM memory cell using the fin-gate-type double-gate transistor.

FIG. 31 and FIG. 32 are cross-sectional views schematically showing the structure of the semiconductor memory device according to the third embodiment of the invention. As is shown in FIG. 31 and FIG. 32, in the third embodiment, the concave shape of the cap structure 75 is inverted. In the other structural aspects, the third embodiment is similar to the second embodiment.

With this structure, the same advantages as with the second embodiment can be obtained. In addition, since the cap structure 75 according to this embodiment has a greater thickness at the part that contacts the surface strap ST, it is possible to effectively prevent the material of the surface strap ST from diffusing into the trench capacitor. Accordingly, the retention characteristics can be enhanced.

On the other hand, the cap structure 75 has a less thickness at the central part than at the peripheral part. This reduces contact resistance between the storage node electrode 50 and surface strap ST. Therefore, the switching characteristics can be enhanced. As described above, since the cap structure 75 has a greater thickness at the peripheral part than at the central part, the retention characteristics can be enhanced and the switching characteristics improved.

A method of fabricating the semiconductor device according to this embodiment will now be described, referring to the semiconductor memory device shown in FIGS. 31 and 32 by way of example.

Figure 33A:
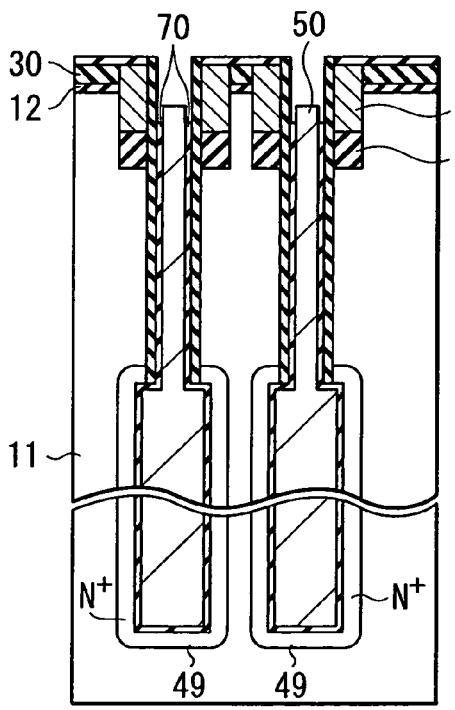
FIG. 33A illustrates a fabrication step of the semiconductor memory device according to the third embodiment of the invention, FIG. 33A being a cross-sectional view taken along line 4—4 in FIG. 2.
Figure 33B:
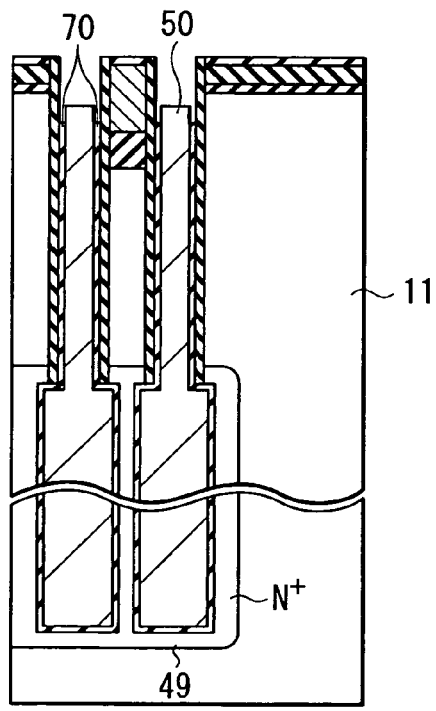
FIG. 33B illustrates a fabrication step of the semiconductor memory device according to the third embodiment of the invention, FIG. 33B being a cross-sectional view taken along line 3—3 in FIG. 2.

As is shown in FIGS. 33A and 33B, through the same steps as in the second embodiment, the storage node electrode 50 and the capacitor insulation film 70 containing high-dielectric-constant material are formed in the trench. The entire surface is subjected to anisotropic etching, e.g. RIE, with a selected reaction gas, thereby recessing an upper part of the storage node electrode 50. Then, wet etching, for instance, is carried out to recess an upper part of the capacitor insulation film 70 so that the storage node electrode 50 may project from the capacitor insulation film 70. In the wet etching step, an etchant, etc., which etches the collar insulation film 47 at a higher etching rate than the storage node electrode 50, is selected.

Figure 34A:
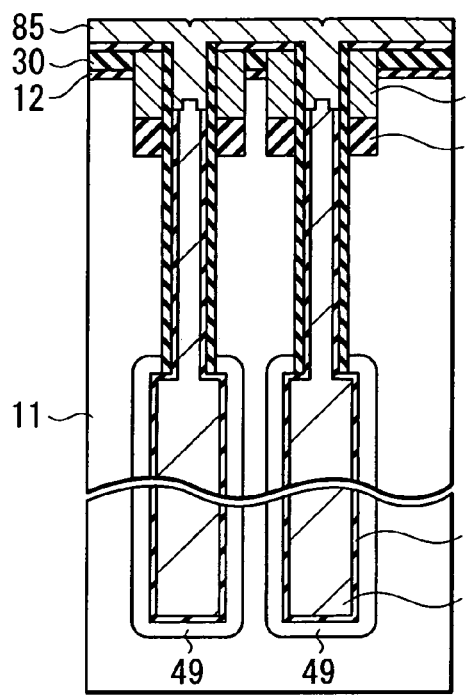
FIG. 34A illustrates a fabrication step of the semiconductor memory device according to the third embodiment of the invention, FIG. 34A being a cross-sectional view taken along line 4—4 in FIG. 2.
Figure 34B:
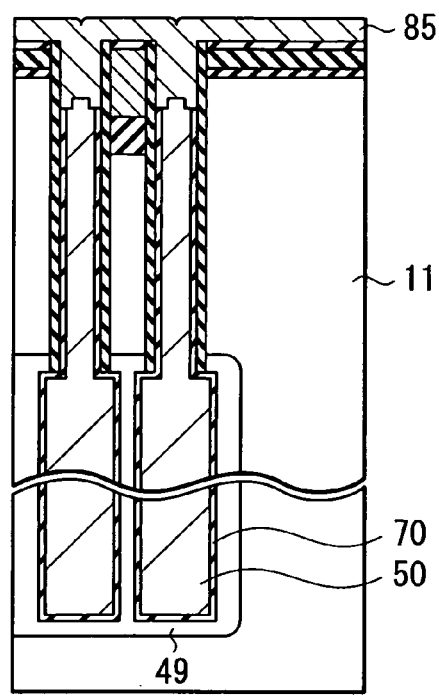
FIG. 34B illustrates a fabrication step of the semiconductor memory device according to the third embodiment of the invention, FIG. 34B being a cross-sectional view taken along line 3—3 in FIG. 2.

Subsequently, as shown in FIG. 34A and FIG. 34B, polysilicon 85, etc. is deposited by, e.g. CVD, over the entire surface, and the polysilicon 85 is buried in the trench.

Figure 35A:
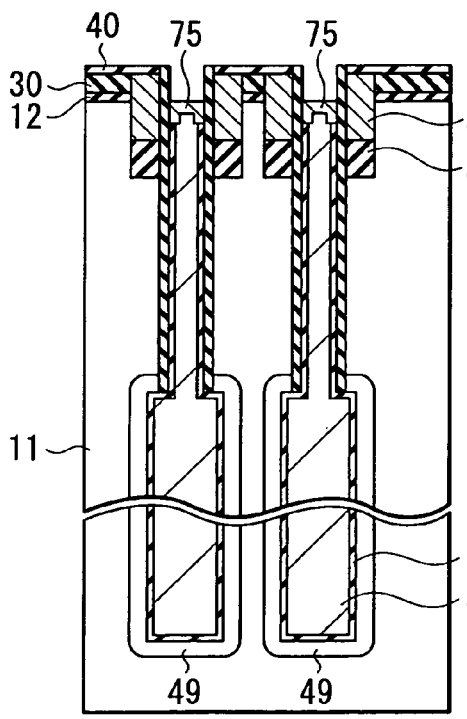
FIG. 35A illustrates a fabrication step of the semiconductor memory device according to the third embodiment of the invention, FIG. 35A being a cross-sectional view taken along line 4—4 in FIG. 2.
Figure 35B:
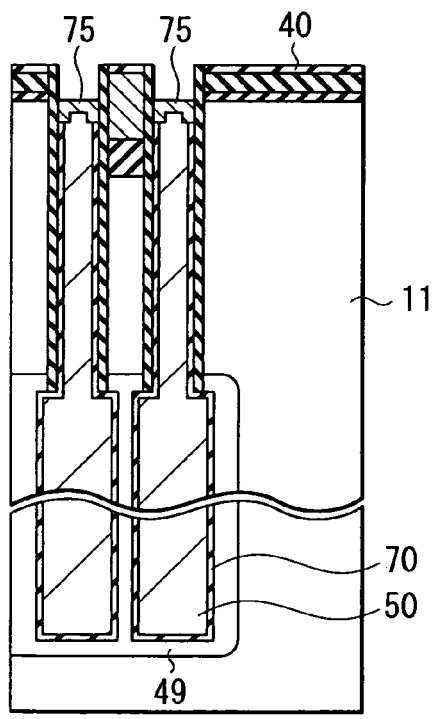
FIG. 35B illustrates a fabrication step of the semiconductor memory device according to the third embodiment of the invention, FIG. 35B being a cross-sectional view taken along line 3—3 in FIG. 2.

In the next step illustrated in FIG. 35A and FIG. 35B, the entire surface is subjected to, e.g. RIE, and anisotropic etching is carried out to the surface of the silicon nitride film 40. Thereby, the cap structure 75 with a thicker peripheral part is formed in a self-alignment fashion.

Following the above, the same steps as in the second embodiment are performed, and the semiconductor memory device as shown in FIGS. 31 and 32 is manufactured.

As illustrated in FIGS. 33A to 35A and FIGS. 33B to 35B, the upper part of the capacitor insulation film 70 is recessed by wet etching with use of an etchant that has a higher etching rate for the collar insulation film 47 than for the storage node electrode 50. Thereby, the storage node electrode 50 is made to project from the capacitor insulation film 70. Subsequently, polysilicon 85, etc. is deposited by, e.g. CVD, over the entire surface, and the polysilicon 85 is buried in the trench. Then, the entire surface is subjected to, e.g. RIE, and anisotropic etching is carried out to the surface of the silicon nitride film 40. Thereby, the cap structure 75 with a thicker peripheral part is formed in a self-alignment fashion.

Through the above-described steps, the cap structure 75 with the inverted concave cross section is formed, and the retention characteristics are improved by the same function as described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a trench capacitor formed in a major surface portion of a semiconductor substrate, the trench capacitor including a storage node electrode provided within a trench that is formed in the major surface portion of the semiconductor substrate, a plate electrode that is disposed to be opposed to the storage node electrode, and a capacitor insulation film that is provided between the storage node electrode and the plate electrode and is formed of a high-dielectric-constant material;
    an insulated-gate-type field-effect transistor that is formed in the major surface portion of the semiconductor substrate;
    a contact portion that electrically connects a source or a drain of the insulated-gate-type field-effect transistor and the storage node electrode; and
    a cap structure formed between the contact portion and upper parts of the storage node electrode, the cap structure including a region lying on the storage node electrode and a region lying on the capacitor insulation film, the region on the capacitor insulation film being thicker than the region on the storage node electrode.

2. The semiconductor memory device according to claim 1, wherein at least a connection portion of the storage node electrode, which is connected to the cap structure, is formed of a metal, and
    wherein the cap structure functions also as a barrier for preventing the metal of the storage node electrode from diffusing into the contact portion.

3. The semiconductor memory device according to claim 2, wherein the metal is at least one selected from the group comprising TiN, W, Al, Ru, Au, Cu, Ag, Pt and Ti.

4. The semiconductor memory device according to claim 1, wherein the capacitor insulation film is a stacked layer including at least one of high-dielectric-constant elements.

5. The semiconductor memory device according to claim 4, wherein the high-dielectric-constant element is at least one selected from the group comprising Al, Ta, Zr, Hf, Pb, Ba and Sr.

6. The semiconductor memory device according to claim 1, wherein the capacitor insulation film includes at least one of high-dielectric-constant elements, or a stacked layer that includes an oxide of at least one of high-dielectric-constant elements.

7. The semiconductor memory device according to claim 6, wherein the high-dielectric-constant element is at least one selected from the group comprising Al, Ta, Zr, Hf, Pb, Ba and Sr.

8. The semiconductor memory device according to claim 1, wherein the cap structure is formed of polysilicon or a metal.

9. The semiconductor memory device according to claim 8, wherein the metal is at least one selected from the group comprising TiN, W, Al, Ru, Au, Cu, Ag, Pt and Ti.

10. The semiconductor memory device according to claim 1, wherein at least one of the storage node electrode and the cap structure is formed of TaN, WN or TiN.

11. The semiconductor memory device according to claim 1, wherein the insulated-gate-type field-effect transistor is of a fin-gate type or a planar type.

12. The semiconductor memory device according to claim 1, wherein at least a portion of an upper pan of the trench capacitor is substantially flush with the major surface of the semiconductor substrate or projects from the major surface of the semiconductor substrate, and a plan-view shape of the trench capacitor is circular or oval.

13. The semiconductor memory device according to claim 1, wherein the cap structure formed between the contact portion and the capacitor insulation film, the cap structure functioning as a barrier for preventing the high-dielectric-constant material of the capacitor insulation film from diffusing into the contact portion.

\* \* \* \* \*

UNITED STATES PATENT AND TRADEMARK OFFICE
CERTIFICATE OF CORRECTION

| | | |
|---|---|---|
| PATENT NO. | : 7,019,349 B2 | Page 1 of 1 |
| APPLICATION NO. | : 10/817954 | |
| DATED | : March 28, 2006 | |
| INVENTOR(S) | : Ryota Katsumata et al. | |

It is certified that error appears in the above-identified patent and that said Letters Patent is hereby corrected as shown below:

In Column 20, Claim 12, Line 37:
    Please replace "pan" with --part--

Signed and Sealed this

Fifteenth Day of August, 2006

JON W. DUDAS
*Director of the United States Patent and Trademark Office*